United States Patent
Baek

(10) Patent No.: US 9,299,842 B2
(45) Date of Patent: Mar. 29, 2016

(54) FIN TRANSISTOR AND SEMICONDUCTOR INTEGRATED CIRCUIT INCLUDING THE SAME

(71) Applicant: Samsung Electronics Co., Ltd., Suwon-Si, Gyeonggi-Do (KR)

(72) Inventor: Sang-hoon Baek, Seoul (KR)

(73) Assignee: SAMSUNG ELECTRONICS CO., LTD., Gyeonngi-Do (KR)

( * ) Notice: Subject to any disclaimer, the term of this patent is extended or adjusted under 35 U.S.C. 154(b) by 145 days.

(21) Appl. No.: 14/026,345

(22) Filed: Sep. 13, 2013

(65) Prior Publication Data

US 2014/0077303 A1 Mar. 20, 2014

(30) Foreign Application Priority Data

Sep. 14, 2012 (KR) .......................... 10-2012-0102266

(51) Int. Cl.

| | |
|---|---|
| *H01L 29/76* | (2006.01) |
| *H01L 29/78* | (2006.01) |
| *G06F 17/50* | (2006.01) |
| *H01L 21/8238* | (2006.01) |
| *H01L 29/66* | (2006.01) |
| *H01L 27/092* | (2006.01) |

(52) U.S. Cl.
CPC .......... *H01L 29/785* (2013.01); *G06F 17/5063* (2013.01); *G06F 17/5081* (2013.01); *H01L 21/823821* (2013.01); *H01L 27/0924* (2013.01); *H01L 29/6681* (2013.01)

(58) Field of Classification Search
None
See application file for complete search history.

(56) References Cited

U.S. PATENT DOCUMENTS

| 7,013,447 | B2 | 3/2006 | Mathew et al. |
|---|---|---|---|
| 7,227,183 | B2 | 6/2007 | Donze et al. |
| 7,301,210 | B2 | 11/2007 | Abadeer et al. |
| 7,315,994 | B2 | 1/2008 | Aller et al. |
| 7,608,890 | B2 | 10/2009 | Yagishita |
| 7,629,651 | B2 | 12/2009 | Nakajima |
| 7,763,531 | B2 * | 7/2010 | Abadeer ............ G01R 31/2831 257/E21.421 |
| 7,812,373 | B2 | 10/2010 | Bauer et al. |
| 7,829,951 | B2 | 11/2010 | Song et al. |
| 7,932,567 | B2 | 4/2011 | Mizumura et al. |
| 8,020,121 | B2 | 9/2011 | Kobayashi |
| 2007/0284669 | A1 | 12/2007 | Abadeer et al. |
| 2009/0134472 | A1 * | 5/2009 | Inaba ...................... H01L 21/84 257/390 |
| 2013/0196508 | A1 * | 8/2013 | LicCausi ...................... 438/696 |

* cited by examiner

*Primary Examiner* — Sonya D McCall Shepard
(74) *Attorney, Agent, or Firm* — Harness, Dickey & Pierce, P.L.C.

(57) ABSTRACT

Provided are a fin transistor including a plurality of fins and a semiconductor integrated circuit including a plurality of fin transistors. A width of at least one fin of the plurality of fins is different from widths of the other fins, and each width of the plurality of fins is individually determined based on the electrical characteristics of the fin transistor.

16 Claims, 17 Drawing Sheets

FIN TRANSISTOR AND SEMICONDUCTOR INTEGRATED CIRCUIT INCLUDING THE SAME

CROSS-REFERENCE TO RELATED APPLICATIONS

This application claims the benefit of Korean Patent Application No. 10-2012-0102266, filed on Sep. 14, 2012, in the Korean Intellectual Property Office, the disclosure of which is incorporated herein in its entirety by reference.

BACKGROUND

Example embodiments of inventive concepts relate to a semiconductor integrated circuit, and more particularly, to a fin transistor, a semiconductor integrated circuit including the same, and an apparatus and method for designing the semiconductor integrated circuit.

A fin transistor, such as a fin field-effect transistor (finFET) or a fin type transistor, is a three-dimensional (3D) transistor having a fin structure protruding from a substrate. Since it is possible to use an entire surface of the fin structure as a channel region in the fin transistor, a sufficient channel length may be ensured. Accordingly, a short channel effect may be prevented or minimized, and thus, problems such as the occurrence of leakage current and a small area caused by the short channel effect in a conventional planar transistor may be solved.

SUMMARY

According to an aspect of some example embodiments of inventive concepts, there is provided a fin transistor including a plurality of fins, wherein a width of at least one fin of the plurality of fins is different from widths of the other fins, and each width of the plurality of fins is individually determined based on electrical characteristics of the fin transistor.

The width of the at least one fin may be indicated by a mark layer to change the width based on the electrical characteristics of the fin transistor. The width of the at least one fin of the fin transistor may be changed according to a new library generated by using the mark layer.

The mark layer may include at least one of: a first mark layer that indicates an increase in a width of at least one fin set in a previously designed layout; and a second mark layer that indicates a decrease in the width of the at least one fin set in the previously designed layout. The first and second mark layers may be distinguished from each other by using at least one of different colors and different boundaries.

A pitch between the plurality of fins may be constant even when the width of the at least one fin is changed.

The mark layer may include at least one of: a first mark layer that indicates the at least one fin; and a second mark layer that indicates the fin transistor including the at least one fin.

The plurality of fins may include at least one active fin. The plurality of fins may include at least one dummy fin.

When all of the plurality of fins are active fins, a number of the plurality of fins is r, and a number of selectable widths is n (r and n are natural numbers equal to or greater than 2), a number of cases for a total width of the fin transistor may be nHr, which is a repeating combination based on the numbers r and n.

When a number of the plurality of fins is r and a number of selectable widths is n (r and n are natural numbers equal to or greater than 2), a number of cases for a total width of the fin transistor may be $$\sum_{i=1}^{r} nHi,$$

which is a sum of repeating combinations based on the numbers r and n.

The electrical characteristics of the fin transistor may be determined based on a set value of a ratio of a rising time to a falling time of the fin transistor. The electrical characteristics of the fin transistor may be determined based on a set value of a ratio of a low-to-high propagation delay time to a high-to-low propagation delay time of the fin transistor.

The each width of the plurality of fins may be a width shown in a two-dimensional (2D) layout.

According to another aspect of some example embodiments of inventive concepts, there is provided a semiconductor integrated circuit including a plurality of fin transistors, wherein at least one fin transistor from among the plurality of fin transistors includes a plurality of fins, and a width of at least one fin from among the plurality of fins is different from widths of the other fins, wherein each width of the plurality of fins is individually determined based on the electrical characteristics of at least one of the semiconductor integrated circuit and the fin transistor.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
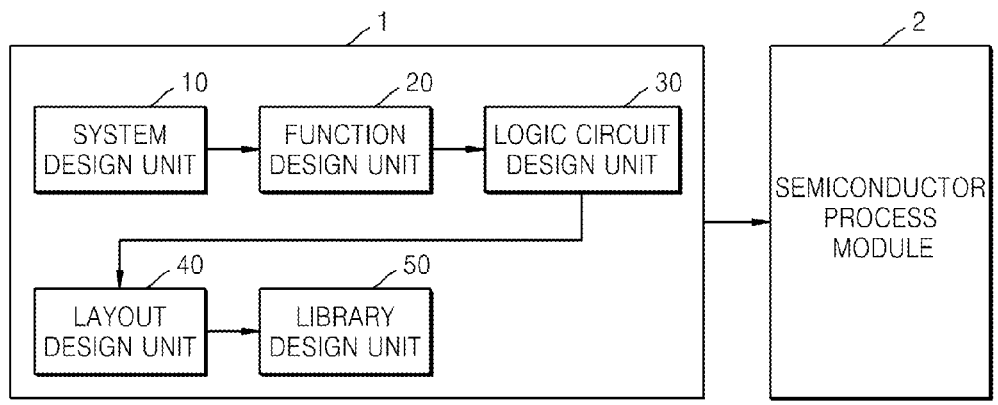
FIG. 1 is a block diagram illustrating an apparatus for designing a semiconductor integrated circuit, according to an example embodiment of inventive concepts.

As used herein, the term "and/or" includes any and all combinations of one or more of the associated listed items. Expressions such as "at least one of," when preceding a list of elements, modify the entire list of elements and do not modify the individual elements of the list.

Example embodiments of inventive concepts will now be described more fully with reference to the accompanying drawings, in which some example embodiments of inventive concepts are shown. It should be understood, however, that there is no intent to limit the example embodiments of inventive concepts to the particular forms disclosed, but conversely, the example embodiments of inventive concepts are to cover all modifications, equivalents, and alternatives falling within the spirit and scope of the example embodiments of inventive concepts. Like reference numerals denote like elements in the drawings. In the attached drawings, sizes of structures may be exaggerated for clarity.

The terminology used herein is for the purpose of describing particular example embodiments only and is not intended to be limiting of the example embodiments of inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Unless otherwise defined, all terms (including technical and scientific terms) used herein have the same meaning as commonly understood by one of ordinary skill in the art to which example embodiments of the present invention belong. It will be further understood that the terms, such as those defined in commonly used dictionaries, should be interpreted as having meanings that are consistent with their meanings in the context of the relevant art and will not be interpreted in an idealized or overly formal sense unless expressly so defined herein.

FIG. 1 is a block diagram illustrating an apparatus 1 for designing a semiconductor integrated circuit, according to an example embodiment of inventive concepts.

Referring to FIG. 1, the apparatus 1 may include a system design unit 10, a function design unit 20, a logic circuit design unit 30, a layout design unit 40, and a library design unit 50. A design result provided by the apparatus 1 may be transmitted to a semiconductor process module 2 and may be implemented as a semiconductor circuit.

The system design unit 10 may be used to design a system including a semiconductor integrated circuit. For example, the system design unit 10 may be used to select a system including a semiconductor integrated circuit. The system may be a memory system, a computing system, or a communication system. For convenience of explanation, the apparatus 1 will be described assuming that the system is a memory system.

The function design unit 20 may be used to design the semiconductor integrated circuit according to the characteristics of the system. For example, when the system is a memory system, since a memory device and a memory controller for controlling the memory device are required, the function design unit 20 may design functions needed for the memory controller.

The logic circuit design unit 30 may design logic circuits included in the semiconductor integrated circuit based on the functions. For example, the logic circuit design unit 30 may design logic circuits such as a logic gate, an OR gate, an AND gate, and a flip-flop based on the functions needed for the memory controller.

The layout design unit 40 may design a layout of the semiconductor integrated circuit based on the logic circuits. For example, the layout design unit 40 may design a layout according to the logic circuits, such as an OR gate, an AND gate, and a flip-flop. In this case, the layout indicates an arrangement and wiring states of elements in the semiconductor integrated circuit.

A process of designing the layout has become more time and cost-consuming with recent advances in the high integration of semiconductor devices. Accordingly, as a time and cost-effective technology, a standard cell-based layout design method may be used. The standard cell-based layout design method may reduce the time to design a layout by previously designing elements such as an OR gate and an AND gate which are repeatedly used as standard cells in a computer system, and then arranging and wiring the standard cells in necessary places.

The library design unit 50 may design a library of the semiconductor integrated circuit based on the layout. For example, the library design unit 50 may design a cell library of cells included in the semiconductor integrated circuit. The library refers to a set of related files. For example, names, dimensions, gate widths, pins, delay characteristics, leakage currents, threshold voltages, and functions of cells may be defined in the cell library.

In the present example embodiment, the library design unit 50 may generate a new library by generating a mark layer that indicates at least one fin corresponding to at least one fin from among a plurality of fins of a fin transistor, wherein a width of the at least one fin of the fin transistor is to be changed based on a change in characteristics such as the electrical characteristics or thermal characteristics of a semiconductor element or the fin transistor included in the semiconductor element, and applying the mark layer to a previously created layout.

According to the new library, the width of the at least one fin from among the plurality of fins of the fin transistor may be different form widths of the other fins. As such, the fin transistor including the plurality of fins with different widths may be referred to as a 'multi-width fin transistor' or a 'multi-fin transistor.'

In general, since a plurality of fins included in a fin transistor are arranged with a predetermined pitch, it is not easy to change widths of the plurality of fins. Also, since the widths of the plurality of fins are determined to have the same value from among discrete values according to a design rule or design constraints, it is not easy to finely change the widths of the plurality of fins of the fin transistor based on a change in the characteristics of a semiconductor element or the fin transistor.

However, according to the present example embodiment, since the width of the at least one fin from among the plurality of fins is determined to be different from the widths of the other fins based on a change in the characteristics of the semiconductor element or the fin transistor, the widths of the plurality of fins included in the fin transistor may be finely adjusted. Also, according to the present example embodiment, since the previously created layout, instead of a newly designed layout, is used even when there is a change in the characteristics of the semiconductor element or the fin transistor, the time and costs to design the semiconductor integrated circuit may be greatly reduced.

Figure 2:
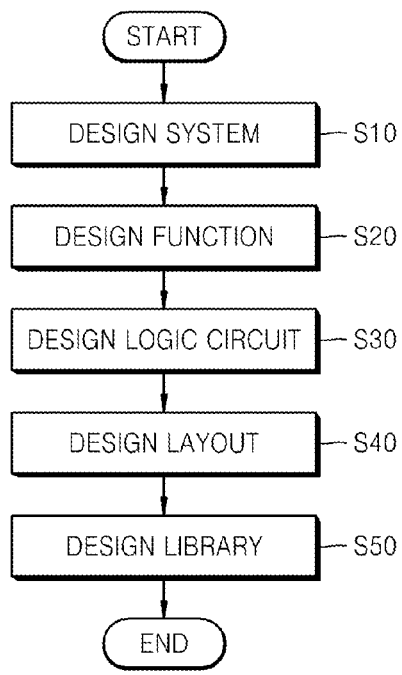
FIG. 2 is a flowchart illustrating a method of designing a semiconductor integrated circuit, according to an example embodiment of inventive concepts.

FIG. 2 is a flowchart illustrating a method of designing a semiconductor integrated circuit, according to an example embodiment of inventive concepts.

Referring to FIG. 2, the method includes operations sequentially performed by the semiconductor integrated circuit of FIG. 1. Accordingly, although omitted below, the descriptions of the apparatus 1 of FIG. 1 also apply to the method of FIG. 2.

In operation S10, a system including a semiconductor integrated circuit is designed. In operation S20, functions of the semiconductor integrated circuit are designed based on the system. In operation S30, logic circuits included in the semiconductor integrated circuit are designed based on the functions. In operation s40, a layout of the semiconductor integrated circuit is designed based on the logic circuits. In operation S50, a library of the semiconductor integrated circuit is designed based on the layout.

In the present example embodiment, the designing of the library may include generating a new library by generating a mark layer that indicates at least one fin corresponding to at least one fin from among a plurality of fins of a fin transistor, wherein a width of the at least one fin of the fin transistor is to be changed based on a change in the characteristics of a semiconductor element or the fin transistor, and applying the mark layer to a previously created layout.

In the present example embodiment, a photomask may be formed by performing optical proximity correction (OPC) based on a new library designed according to the method of designing a semiconductor integrated circuit. Next, a semiconductor integrated circuit according to the new library may be formed by performing an exposure process using the photomask on a wafer and forming a wafer pattern according to the new library.

For example, according to the present example embodiment, optical proximity correction is performed based on a new library in which a width of at least one fin from among a plurality of fins constituting a fin transistor is changed based on a change in the characteristics of a semiconductor element or the fin transistor. Accordingly, a semiconductor integrated circuit including the at least one fin transistor whose width is different from widths of the other fins from among the plurality of fins, that is, a multi-fin transistor, may be formed. In this case, since a previously created layout is used without newly designing a layout even when the characteristics of the semiconductor element are changed, the time and costs to design the semiconductor integrated circuit may be greatly reduced.

The method may be executed using a program for designing a semiconductor integrated circuit on a computer. As such, the method may be implemented by performing the program for designing a semiconductor integrated circuit on the computer. Accordingly, the method may be embodied as a computer-readable code on a non-transitory computer-readable recording medium.

The non-transitory computer-readable recording medium includes any storage device that may store data that may be read by a computer system. Examples of the non-transitory computer-readable recording medium include read-only memories (ROMs), random-access memories (RAMs), CD-ROMs, magnetic tapes, floppy disks, and optical data storage devices. The non-transitory computer-readable recording medium may be distributed over network-coupled computer systems so that the computer-readable code is stored and executed in a distributed fashion.

Figure 3:
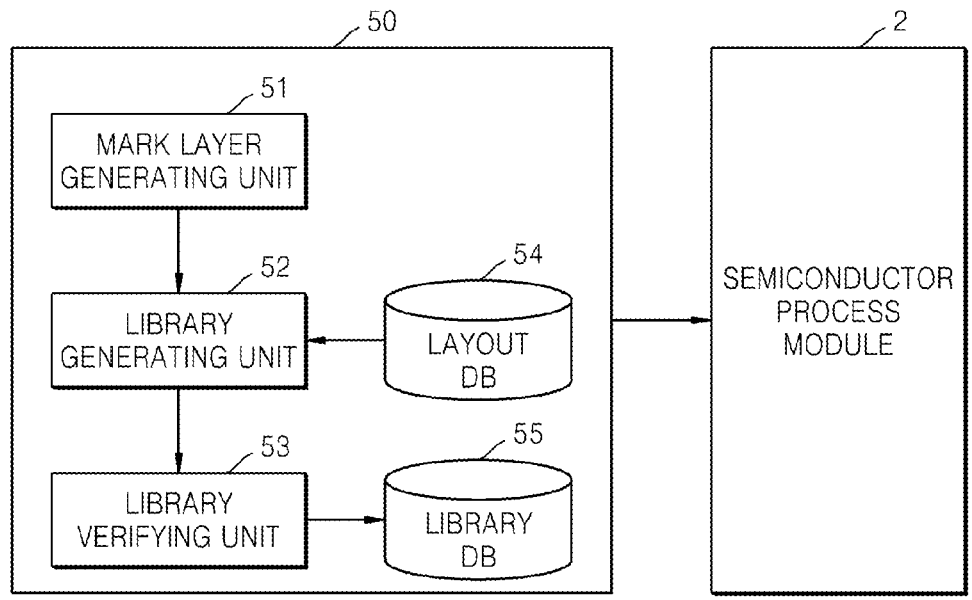
FIG. 3 is a block diagram illustrating a library design unit included in the apparatus of FIG. 1.

FIG. 3 is a block diagram illustrating the library design unit 50 of the apparatus 1 of FIG. 1.

Referring to FIG. 3, the library design unit 50 may indicate a mark layer generating unit 51, a library generating unit 52, a library verifying unit 53, a layout database (DB) 54, and a library DB 55. A library designed by the library design unit 50 may be transmitted to the semiconductor process module 2 and may be embodied as a semiconductor integrated circuit.

The mark layer generating unit 51 may generate a mark layer that indicates at least one fin corresponding to at least one fin from among a plurality of fins of a fin transistor, wherein a width of the at least one fin of the fin transistor is to be changed based on a change in the characteristics such as electrical characteristics or thermal characteristics of a semiconductor element or the fin transistor. In this case, a mark layer may be referred to as an annotation layer.

According to a change in the characteristics of the semiconductor element or the fin transistor, at least one of a height and a width of the at least one fin from among the plurality of fins constituting the fin transistor and a space between two adjacent fins may be changed. However, as a semiconductor element is scaled down, it is difficult to manufacture the semiconductor element by sufficiently reflecting a change in the characteristics of the semiconductor element by using only implantation. Accordingly, a method of generating a mark layer that indicates at least one fin having at least one of a height, a width, and a space according to a change in the characteristics of the semiconductor element or the fin transistor is desired.

When a plurality of fins are arranged with a predetermined pitch, even when a width of a fin is changed and a space is accordingly changed, the predetermined pitch may not be changed. Accordingly, a new library that changes a design of a fin transistor and a semiconductor element including the fin transistor without violating a design rule may be generated.

The mark layer generating unit 51 may generate a first mark layer (not shown) that indicates a fin for changing a width of at least one fin of the fin transistor. Alternatively, the mark layer generating unit 51 may generate a second mark layer (not shown) that indicates a fin transistor for changing a width of at least one fin of the fin transistor. Alternatively, the mark layer generating unit 51 may generate a third mark layer (not shown) that indicates a cell including the fin transistor including the fin whose width is to be changed. For example, the third mark layer may indicate a cell boundary. Alternatively, the mark layer generating unit 51 may generate at least two layers from among the first through third mark layers, which will be explained below with reference to FIGS. 23 through 25.

The library generating unit 52 may generate a new library in which the width of the at least one fin is changed by applying any mark layer generated by the mark layer generating unit 51 to a previously created layout. For example, the previously created layout may be one of a plurality of layouts stored in the layout DB 54.

According to the present example embodiment, a new library may be generated by applying a mark layer to a previously created layout instead of designing a new layout according to a change in the characteristics of a semiconductor element or a fin transistor. Accordingly, a time to design a layout may be reduced, and thus, time and costs to design a semiconductor integrated circuit may be reduced greatly.

The library verifying unit 53 may verify whether the new library generated by the library generating unit 52 satisfies a set condition. For example, the library verifying unit 53 may evaluate the new library. The evaluation may be performed by reflecting the changed width in the new library on netlist extraction. The evaluation may include extracting timing information such as a delay in signal transmission between terminals, a set up/hold time, or a pulse width, a parameter such as power consumption, the number of transistors, a height/width of a cell, or a terminal capacitance, and technology-dependent information values such as a pin capacitance.

The layout DB 54 may store a layout designed by the layout design unit 4 of FIG. 1 and the library DB 55 may store a library provided by the library verifying unit 53. The library DB 55 may store various cell libraries, and may provide at least one of the various cell libraries according to a user's request.

Figure 4:
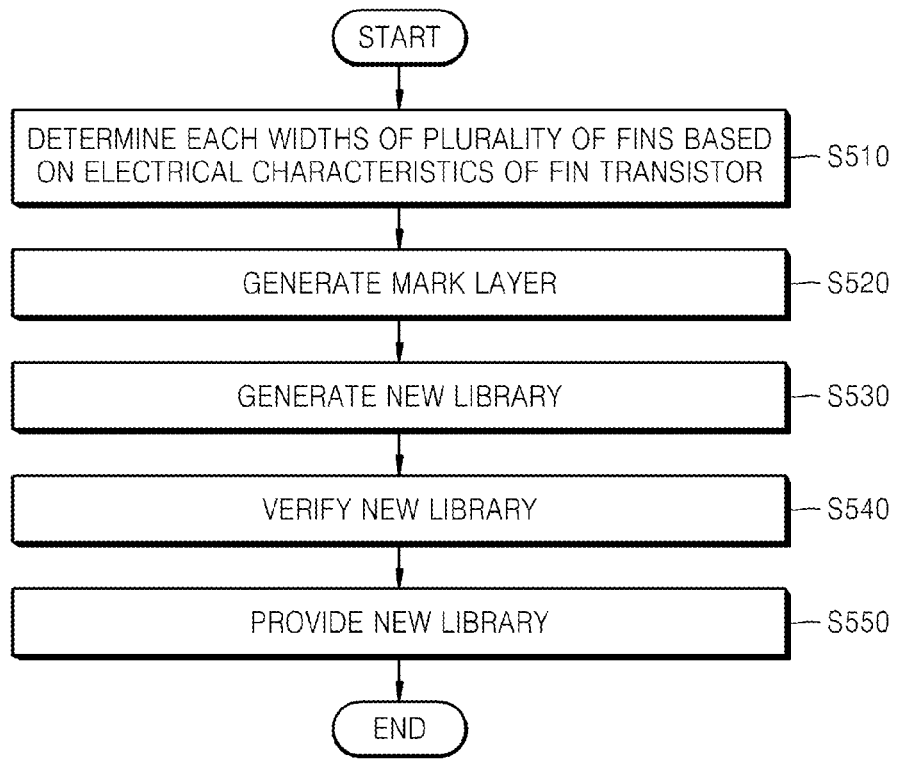
FIG. 4 is a flowchart illustrating an operation of designing a library in the method of FIG. 2.

FIG. 4 is a flowchart illustrating an operation of designing a library using the method of FIG. 2.

Referring to FIG. 4, the operation of designing a library includes operations sequentially performed by the library design unit 50 of FIG. 3. Accordingly, although omitted, descriptions of the library design unit 50 of FIG. 3 may also apply to the operation of FIG. 4.

In operation S510, the apparatus may determine widths of the plurality of fins based on the electrical characteristics of the fin transistor. For example, the apparatus may determine the widths of the plurality of fins based on at least one of a design rule and design constraints along with the electrical characteristics of the fin transistor. Alternatively, operation S510 may be performed before the operation of designing a library.

In operation S520, the apparatus 1 generates a mark layer that indicates at least one fin whose width is to be changed based on a determined changed amount. In operation S530, the apparatus 1 generates a new library by applying the mark layer to a previously created layout. In operation S540, the apparatus 1 verifies whether the new library satisfies a desired condition. In operation S550, the apparatus 1 provides the verified new library to a customer who wants the verified new library.

Figure 5:
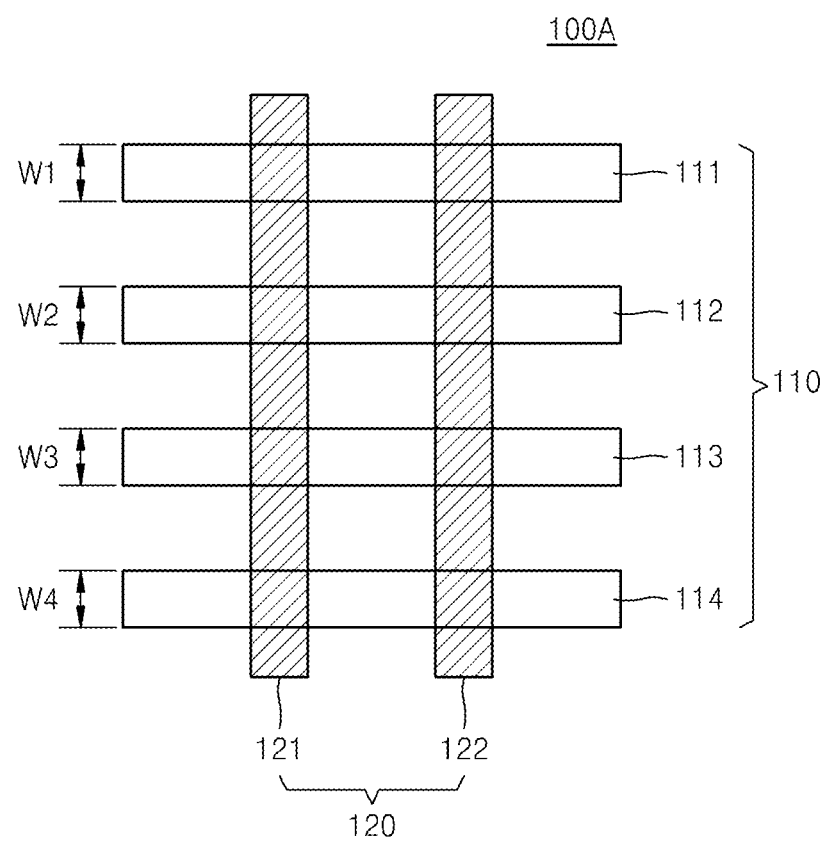
FIG. 5 is an initial layout of a fin transistor according to an example embodiment of inventive concepts.

FIG. 5 is an initial layout of a fin transistor 100A according to an example embodiment of inventive concepts.

Referring to FIG. 5, the fin transistor 100A may include a plurality of fins 110 and a plurality of gate electrodes 120. Although FIG. 5 illustrates the plurality of fins 110 including fins 111-114, that is, first fin 111 through fourth fin 114, and the plurality of gate electrodes 120 include gate electrodes 121 and 122, example embodiments are not limited thereto. Instead, the number of fins included in the plurality of fins 110 and the number of gate electrodes included in the plurality of gate electrodes 120 may vary.

The plurality of fins 110 may include the fins 111-114. According to the present example embodiment, widths W1 through W4, respectively, of the fins 111-114 may be determined to be the same in the initial layout of the fin transistor 100A. In this case, the widths W1 through W4 of the fins 111-114 indicate widths displayed in a two-dimensional (2D) layout. Since FIG. 5 is a 2D layout, height information of the fins 111-114 is not shown.

According to the present example embodiment, the widths W1 through W4 of the fins 111-114 may be determined to be different from one another based on the electrical characteristics of the fin transistor 100A. A new library may be generated by generating a mark layer indicating a fin whose width is to be changed and applying the mark layer to an initial layout, for example, a previously created (designed) layout.

At least one of the fins 111-114 may be an active fin. Alternatively, at least one of the fins 111-114 may be a dummy fin. As such, since some of the plurality of fins 110 of the fin transistor 100A are dummy fins, a total channel width and a total channel length of the fin transistor 100A may be changed. A total channel width of the fin transistor 100A may increase in proportion to the number of active fins from among the fins 111-114, and thus, the amount of current flowing through the fin transistor 100A may increase.

A situation where all of the plurality of fins 110 of the fin transistor 100A are active fins will be described. For example, when the number of the plurality of fins 110 of the fin transistor 100A is r (r is a natural number equal to or greater than 2) and the number of selectable widths is n, the number of cases for a total width of the fin transistor 100A may be nHr (that is, (n+r−1)Cr), which is a repeating combination based on the numbers r and n. The repeating combination refers to the number of cases where r elements are repeatedly selected from among n elements.

When widths of the plurality of fins 110 may not be changed, the number of cases for total width of the fin transistor 100A is 1. For example, when the plurality of fins 110 includes 4 active fins and the number of selectable widths is 1 (that is, r=4 and n=1), the number of cases for a total width of the fin transistor 100A is 1H4, that is, 1.

When the fin transistor 100A is a multi-fin transistor, in other words, when widths of the plurality of fins 110 may be changed (with n and r being natural numbers equal to or greater than 2), the number of cases for a total width of the fin transistor 100A may increase. Accordingly, a width of the fin transistor 100A may be finely adjusted based on the electrical characteristics of the fin transistor 100A.

For example, when the plurality of fins 110 includes 4 active fins and the number of selectable widths is 2 (that is, r=4 and n=2), the number of cases for a total width of the fin transistor 100A is 5 (=2H4). Alternatively, when the plurality of fins 110 includes 4 active fins and the number of selectable widths is 3 (that is, r=4 and n=3), the number of cases for a total width of the fin transistor 100A is 15 (=3H4). Alternatively, when the plurality of fins 110 includes 4 active fins and the number of selectable widths is 4 (that is, r=4 and n=4), the number of cases for a total width of the fin transistor 100A is 35 (=4H4).

Next, a situation where some of the plurality of fins 110 may be determined as dummy fins will be described. In this case, when the number of the plurality of fins 110 included in the fin transistor 100A is r and the number of selectable widths is n, the number of cases for total width of the fin transistor 100A may be $$\sum_{i=1}^{r} nHi,$$

which is a sum of repeating combinations based on the numbers r and n.

When widths of the plurality of fins 110 may not be changed, the number of cases for a total width of the fin transistor 100A is determined according to the number of dummy fins from among the plurality of fins 110. For example, when the plurality of fins 110 are 4 active fins and the number of selectable widths is 1 (that is, r=4 and n=1), the number of cases for a total width of the fin transistor 100A is $$4\left(=\sum_{i=1}^{4} 1Hi = 1H1 + 1H2 + 1H3 + 1H4 = 1C1 + 2C2 + 3C3 + 4C4\right).$$

For example, when widths of the fins 111-114 are Wa and there is no dummy fin from among the fins 111-114, a total width of the fin transistor 100A is 4*Wa. When there is one dummy fin from among the fins 111-114, a total width of the fin transistor 100A is 3*Wa. When there are two dummy fins from among the fins 111-114, a total width of the fin transistor 100A is 2*Wa. When there are three dummy fins from among the fins 111-114, a total width of the fin transistor 100A is 1*Wa.

When the fin transistor 100A is a multi-fin transistor, for example if widths of the plurality of fins 110 may be changed (n and r being natural numbers equal to or greater than 2), the number of cases for a total width of the fin transistor 100A may increase. Accordingly, a width of the fin transistor 100A may be further finely adjusted based on the electrical characteristics of the fin transistor 100A.

For example, when the plurality of fins 110 are 4 active fins and the number of selectable widths is 2, for example if each of the fins 111-114 include one of first and second widths Wa and Wb (that is, r=4 and n=2), the number of cases for a total width of the fin transistor 100A is $$14\left(=\sum_{i=1}^{4} 2Hi = 2H1 + 2H2 + 2H3 + 2H4 = 2C1 + 3C2 + 4C3 + 5C4\right).$$

Alternatively, when the plurality of fins 100 are 4 active fins and the number of selectable widths is 3, for example if each of the fins 111-114 include one of first through third widths Wa, Wb, and Wc (that is, r=4 and n=3), the number of cases for a total width of the fin transistor 100A is $$34\left(=\sum_{i=1}^{4} 3Hi = 3H1 + 3H2 + 3H3 + 3H4 = 3C1 + 4C2 + 5C3 + 6C4\right).$$

Alternatively, when the plurality of fins 100 are 4 active fins and the number of selectable widths is 4, for example if each of the fins 111-114 include one of first through fourth widths Wa, Wb, Wc, and Wd (that is, r=4 and n=4), the number of cases for a total width of the fin transistor 100A is $$69\left(=\sum_{i=1}^{4} 4Hi = 4H1 + 4H2 + 4H3 + 4H4 = 4C1 + 5C2 + 6C3 + 7C4\right).$$

Furthermore, when the fin transistor 100A is a complementary metal-oxide-semiconductor (CMOS) transistor, a width of the CMOS transistor may be further finely adjusted by combining a p-channel metal-oxide-semiconductor (PMOS) transistor and an n-channel metal-oxide-semiconductor (NMOS) transistor. For example, when the plurality of fins 110 are 4 active fins and the number of selectable widths is 2, the number of cases for a total width of the CMOS transistor is 196 (=14*14). Alternatively, when the plurality of fins 110 are 4 active fins and the number of selectable widths is 3, the number of cases for a total width of the CMOS transistor is 1156 (=34*34). Alternatively, when the plurality of fins 110 are 4 active fins and the number of selectable widths is 4, the number of cases for a total width of the CMOS transistor is 4761 (=69*69).

A situation where the width W1 of the first fin 111 is determined to be increased and the widths W2 and W3 of the second and third fins 112 and 113 are determined to be decreased based on a change in the electrical characteristics of the fin transistor 100A will be described in detail. For example, mark layers that indicate the fins 111-113 whose widths W1, W2, and W3 are to be changed, are generated, and a new library may be generated by applying the mark layers to a previously created layout, for example, an initial layout. However, example embodiments are not limited thereto and the widths W1 through W4 may vary. Alternatively, the width W1 may be determined to be decreased and the widths W2, W3, and W4 may be determined to be increased. Alternatively, the width W1 may be determined to increase and the widths W2, W3, and W4 may be determined not to change.

Figure 6:
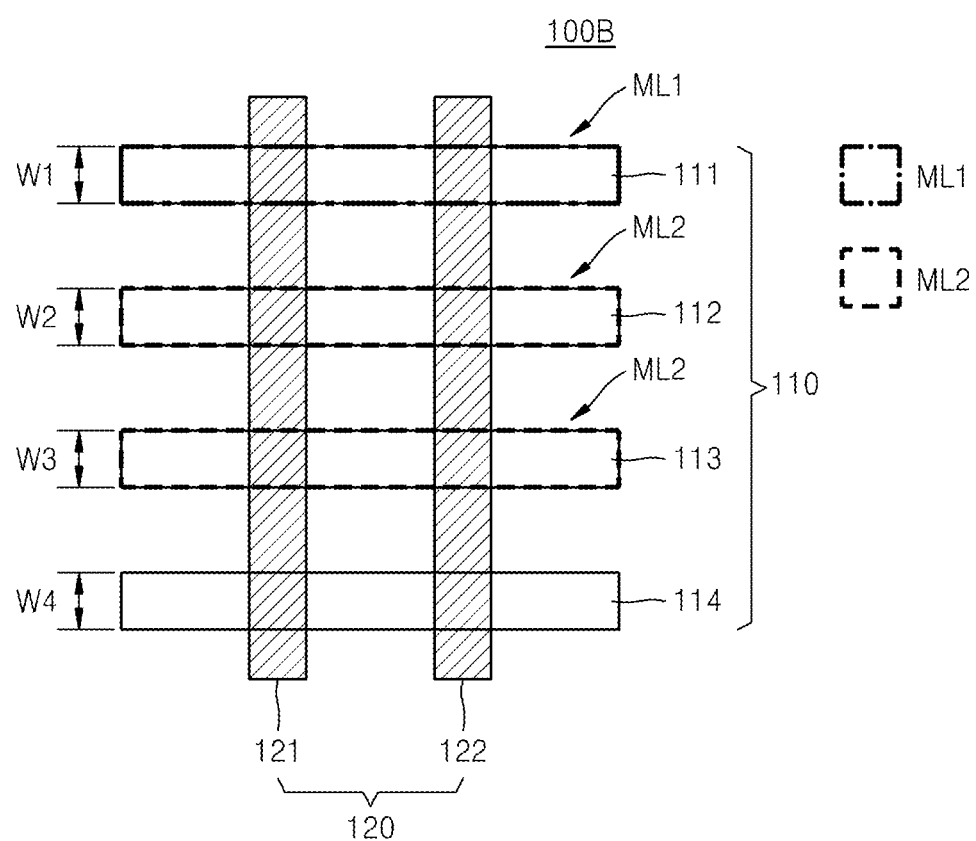
FIG. 6 shows the layout of FIG. 5 to which mark layers are applied.

FIG. 6 shows the layout of FIG. 5 to which mark layers are applied.

Referring to FIG. 6, when the width W1 of the first fin 111 is determined to be increased, a first mark layer ML1 indicating the first fin 111 may be generated. In this case, the first mark layer ML1 may indicate an increase in a width of a fin included in a previously created layout. Also, when the widths W2 and W3 of the second and third fins 112 and 113 are determined to be decreased, a second mark layer ML2 indicating the second and third fins 112 and 113 may be generated. In this case, the second mark layer ML2 may indicate a decrease in the width of the fin included in the previously created layout. The first mark layer ML1 and the second mark layer ML2 may be displayed in different colors. Alternatively, the first mark layer ML1 and the second mark layer ML2 may be displayed with different boundaries.

For example, in an initial layout, the widths W1 through W4 may be 14 nm. In this case, when the width W1 is determined to be increased to 16 nm and the widths W2 and W3 are determined to be decreased to 12 nm, the first and second mark layers ML1 and ML2 that respectively display the first through third fins 111, 112, and 113 whose widths are to be changed may be generated as shown in FIG. 6 without designing a new layout of a fin transistor.

Figure 7:
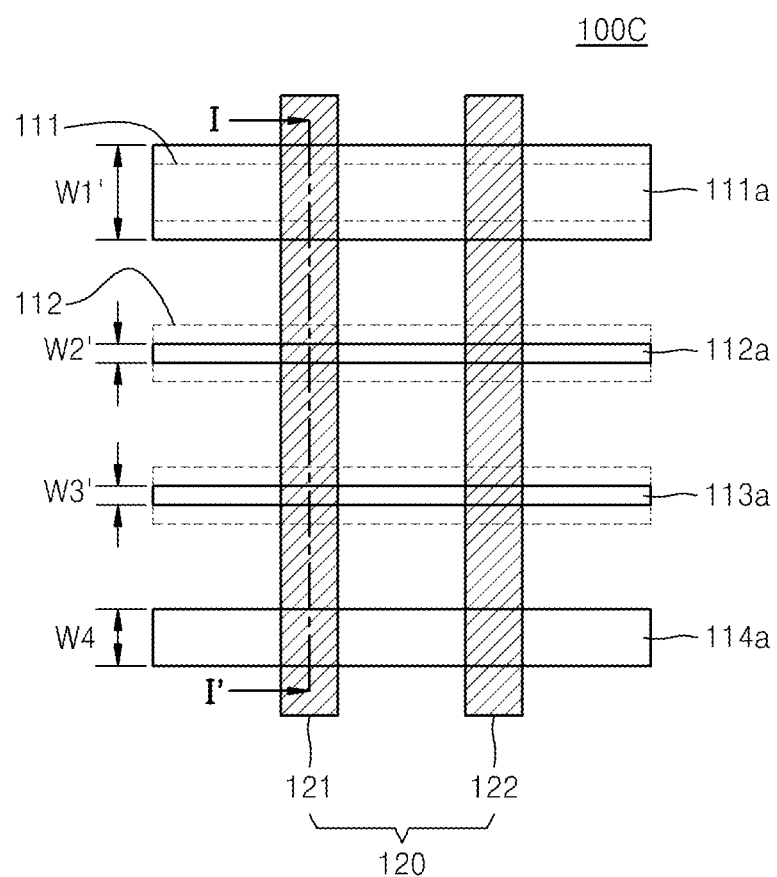
FIG. 7 is a layout of a fin transistor including a fin whose width is changed according to a new library generated based on first and second mark layers of FIG. 6.

FIG. 7 is a layout of a fin transistor 100C including a fin whose width is changed according to a new library generated based on the first and second mark layers ML1 and ML2 of FIG. 6.

Referring to FIG. 7, a new library including fins 111a-114a whose widths W1, W2, and W3 are changed and whose width W4 is not changed may be generated by applying the first and second mark layers ML1 and ML2 to a previously created layout of the fin transistor 100A. Accordingly, widths of the fins 111a-113a may be changed to new widths W1', W2', and W3', respectively, and a width of the fourth fin 114a may be maintained as the width W4.

According to the present example embodiment, a new library may be generated by applying a mark layer to a previously created layout without designing a new layout even when the characteristics of a semiconductor element or a fin transistor are changed and then the new library may be provided to a user. The user may obtain the fin transistor 100C as shown in FIG. 7 by performing optical proximity correction based on the new library to form a photomask and by performing an exposure process using the photomask on a wafer to form a wafer pattern according to the new library.

Figure 8:
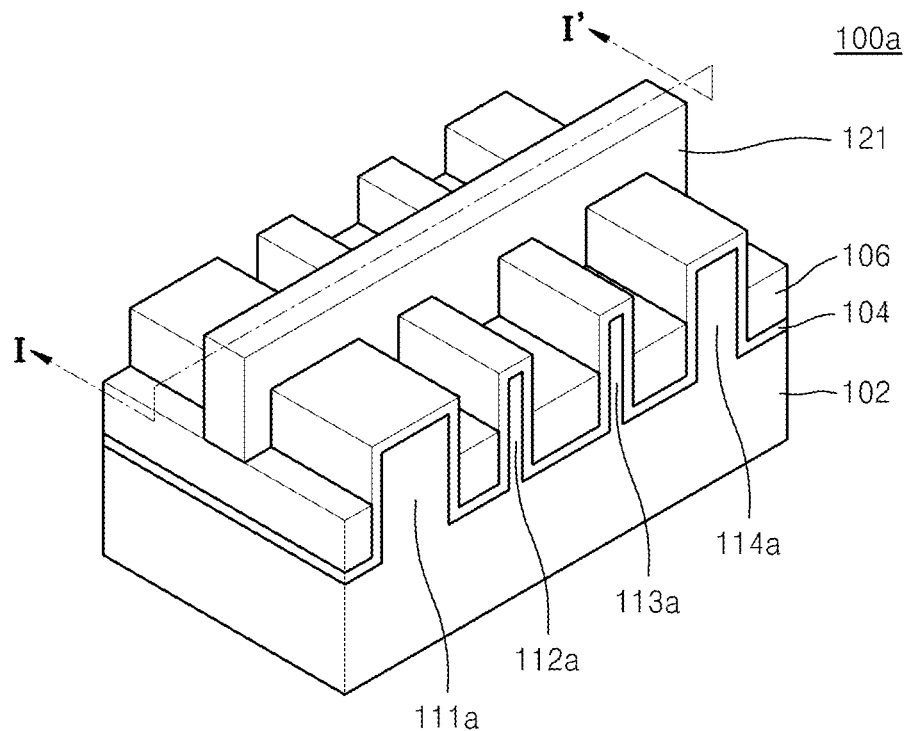
FIG. 8 is a perspective view illustrating a semiconductor device having the layout of FIG. 7, according to an example embodiment of inventive concepts.
Figure 9:
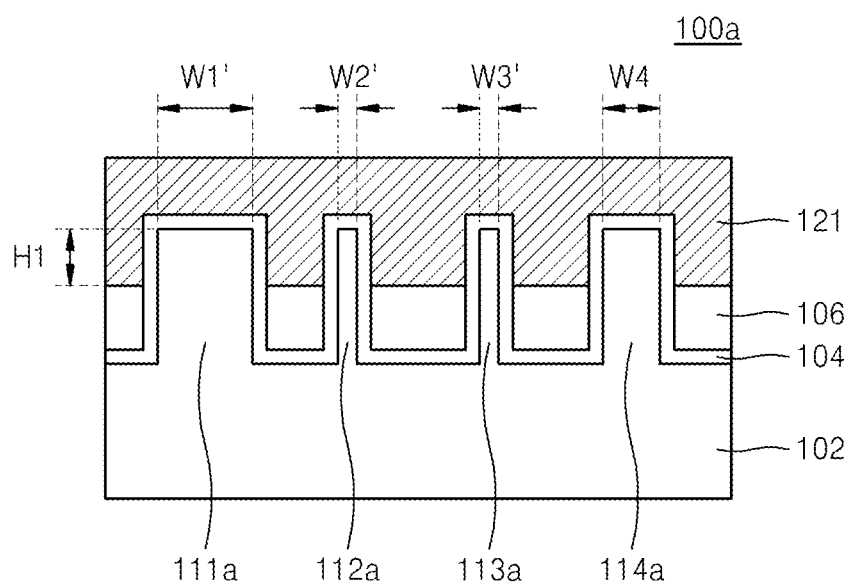
FIG. 9 is a cross-sectional view taken along line I-I' of FIG. 8.

FIG. 8 is a perspective view illustrating a semiconductor apparatus 100a having the layout of FIG. 7, according to an example embodiment of inventive concepts. FIG. 9 is a cross-sectional view taken along line I-I' of FIG. 8.

Referring to FIGS. 8 and 9, the semiconductor apparatus 100a may be a bulk type fin transistor. The semiconductor apparatus 100a may include a substrate 102, a first insulating layer 104, a second insulating layer 106, a plurality of fins 111a-114a, and a gate electrode 121.

The substrate 102 may be a semiconductor substrate and may include at least one of, for example, silicon, silicon-on-insulator (SOI), silicon-on-sapphire (SOS), germanium, silicon-germanium, and gallium-arsenide.

The plurality of fins 111a-114a may be arranged to be connected to the substrate 102. The plurality of fins 111a-114a may be active fins including protruding portions that perpendicularly protrude from the substrate 102 and are n+ or p+ doped. Alternatively, at least one of the plurality of fins 111a-114a may be a dummy fin including a protruding portion that perpendicularly protrudes from the substrate 102 and is not doped. A case where all of the plurality of fins 111a-114a are active fins will be described in detail.

The plurality of fins 111a-114a may have widths W1', W2', W3', and W4', respectively, and a first height H1. In this case, the first height H1 indicates a height from a top surface of the second insulating layer 106 to a top surface of each of the plurality of fins 111a-114a. Accordingly, channel widths (or effective channel widths) of the plurality of fins 111a-114a may be (H1*2+W1'), (H1*2+W2'), (H1*2+W3'), and (H1*2+W4). Also, a total channel width (or a total effective channel width) of the fin transistor 100a may be (H1*8+W1'+W2'+W3'+W4).

The first and second insulating layers 104 and 106 may include an insulating material. For example, the insulating material may include any one of an oxide film, a nitride film, and an oxynitride film. The first insulating layer 104 may be disposed on the plurality of fins 111a-114a. The first insulating layer 104 may be used as a gate insulating film by being disposed between the plurality of fins 111a-114a and the gate electrode 121. The second insulating layer 106 may be disposed in a space between the plurality of fins 111a-114a and may have a predetermined height. The second insulating layer 106 may be used as an element isolating film by being disposed between the plurality of fins 111a-114a.

The gate electrode 121 may be disposed on the first and second insulating layers 104 and 106. Accordingly, the gate electrode 121 may surround the plurality of fins 111a-114a. In other words, the plurality of fins 111a-114a may be disposed in the gate electrode 121. The gate electrode 121 may include a metal material such as tungsten (W) or tantalum (Ta), a nitride thereof, a silicide thereof, or doped polysilicon, and may be formed by using deposition.

Figure 10:
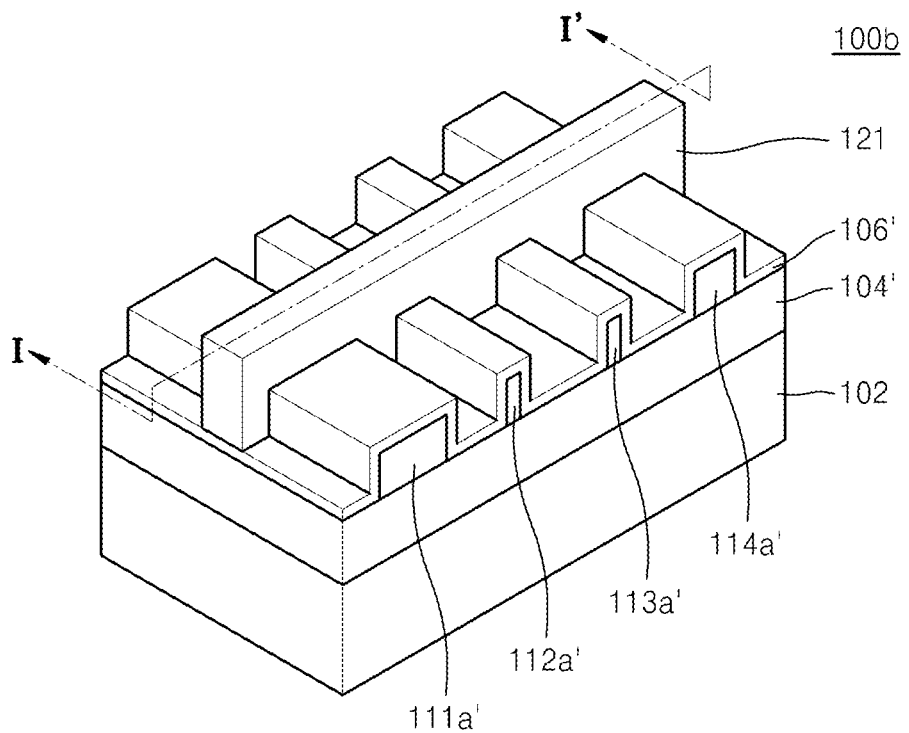
FIG. 10 is a perspective view illustrating a semiconductor device having the layout of FIG. 7, according to another example embodiment of inventive concepts.
Figure 11:
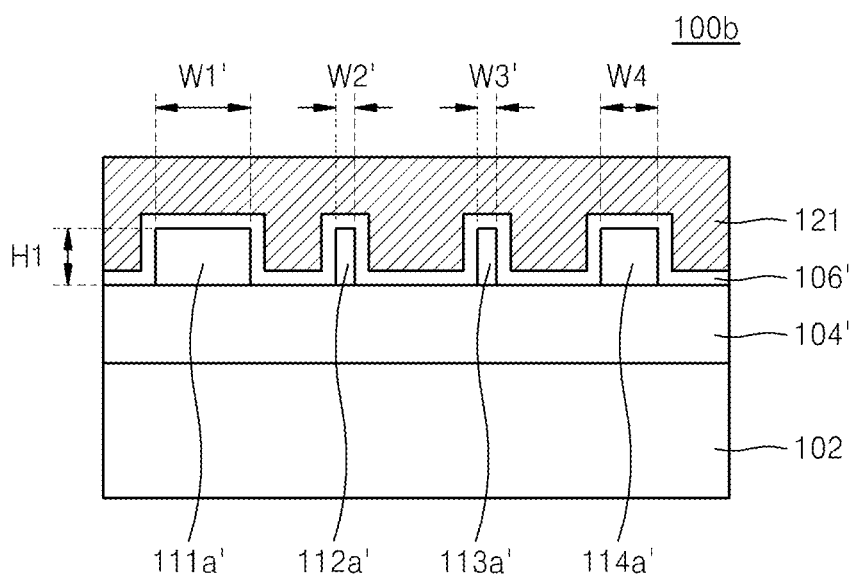
FIG. 11 is a cross-sectional view taken along line I-I' of FIG. 9.

FIG. 10 is a perspective view illustrating a semiconductor apparatus 100b having the layout of FIG. 7, according to another example embodiment of inventive concepts. FIG. 11 is a cross-sectional view taken along line I-I' of FIG. 10.

Referring to FIGS. 10 and 11, the semiconductor apparatus 100b may be a silicon-on-insulator (SOI) type fin transistor. The semiconductor apparatus 100b may include the substrate 102, a first insulating layer 104', a second insulating layer 106', a plurality of fins 111a'-114a', and the gate electrode 121. The semiconductor apparatus 100b of FIG. 10 is a modification of the semiconductor apparatus 100a of FIGS. 8 and 9, and thus, the following explanation will focus only on the differences from the semiconductor apparatus 100a.

The first insulating layer 104' may be disposed on the substrate 102. The second insulating layer 106' may be used as a gate insulating film by being disposed between the plurality of fins 111a'-114a' and the gate electrode 121. The plurality of fins 111a'-114a' may be formed of a semiconductor material, for example, silicon or doped silicon.

The gate electrode 121 may be disposed on the second insulating layer 106'. Accordingly, the gate electrode 121 may surround the plurality of fins 111a'-114a' and the second insulating layer 106'. In other words, the plurality of fins 111a'-114a' may be disposed in the gate electrode 121.

Figure 12:
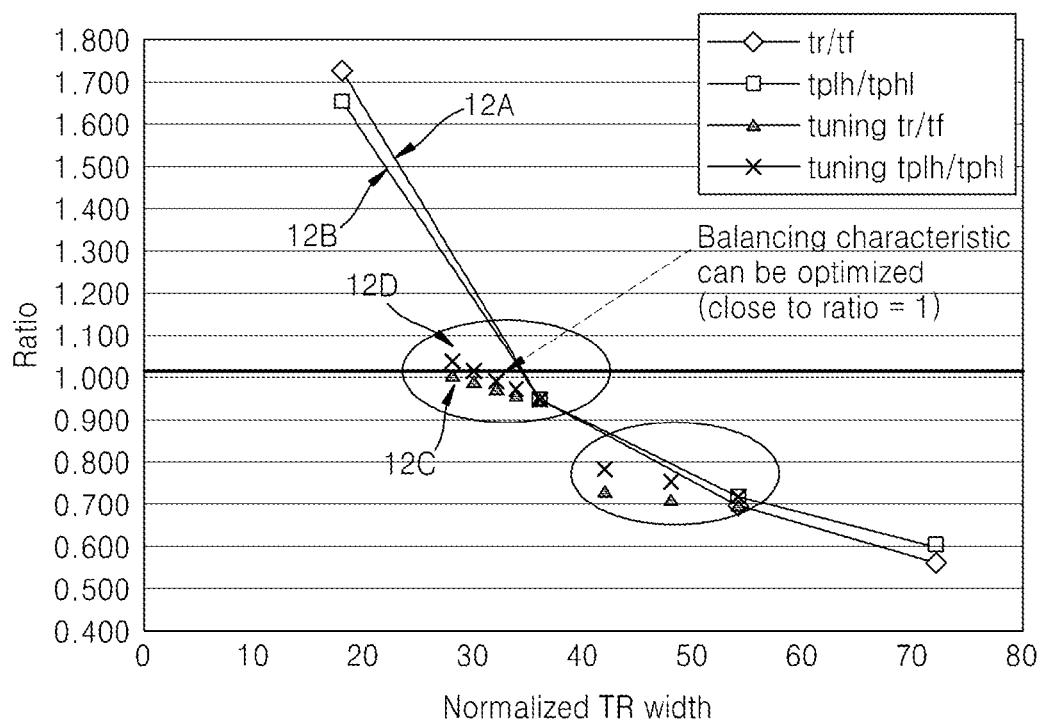
FIG. 12 is a graph illustrating electrical characteristics of a fin transistor.

FIG. 12 is a graph showing electrical characteristics of a fin transistor.

Referring to FIG. 12, the X-axis represents a normalized width of the fin transistor and the Y-axis represents a ratio. Reference symbol '12A' denotes a ratio (that is, tr/tf) of a rising time tf to a falling time tf of the fin transistor, and reference symbol '12B' denotes a ratio (that is, tplh/tphl) of a low-to-high propagation delay time tplh to a high-to-low propagation delay time tphl of the fin transistor. Reference symbol '12C' denotes a ratio (that is, a tuning tr/tf) of the rising time tf to the falling time tf which are finely adjusted, and reference symbol '13D' denotes a ratio (that is, tuning tplh/tphl) of the low-to-high propagation delay time tplh to the high-to-low propagation delay time tphl which are finely adjusted. The propagation delay time refers to a time interval from when an input signal is applied to the fin transistor to when an output signal is generated. The propagation delay time is divided into a low-to-high propagation delay time and a high-to-low propagation delay time according to a direction of an output signal.

For example, when a normalized width of a fin transistor is about 18, a ratio tr/tf of rising/falling times and a ratio tplh/tphl of low-to-high/high-to-low propagation delay times are about 1.7. When a normalized width of a fin transistor is about 35, a ratio tr/tf of rising/falling times and a ratio tplh/tphl of low-to-high/high-to-low propagation delay times are about 0.95. When a normalized width of a fin transistor is about 53, a ratio tr/tf of rising/falling times and a ratio tplh/tphl of low-to-high/high-to-low propagation delay times are about 0.7. When a normalized width of a fin transistor is about 72, a ratio tr/tf of rising/falling times and a ratio tplh/tphl of low-to-high/high-to-low propagation delay times are about 0.6.

When widths of a plurality of fins included in a fin transistor are the same and the plurality of fins have one of 4 normalized widths (that is, widths of the plurality of fins may be discretely changed), a ratio tr/tf of rising/falling times and a ratio tplh/tphl of low-to-high/high-to-low propagation delay times of the fin transistor are changed greatly as the widths of the plurality of fins are changed.

Accordingly, for example, when a ratio tr/tf of rising/falling times is set to be about 1.2, a normalized width of a fin transistor has to be set to be about 30. Since a plurality of fins have the same width and have one of discrete values, a fin transistor having a desired width may not be obtained.

However, according to the present example embodiment, when a normalized width of a fin transistor is about 35, a width of at least one fin from among a plurality of fins included in the fin transistor may be determined to be different from widths of the other fins based on a ratio tr/tf of rising/falling times and a ratio tplh/tphl of low-to-high/high-to-low propagation delay times. For example, in order to set a ratio tr/tf of rising/falling times and a ratio tplh/tphl of low-to-high/high-to-low propagation delay times to be close to 1, widths of the plurality of fins may be finely adjusted.

For example, in order to set a ratio tr/tf of rising/falling times and a ratio tplh/tphl of low-to-high/high-to-low propagation delay times to be close to 1, a normalized width of a fin transistor may be set to be about 30 by finely tuning widths of the plurality of fins. An element having a ratio tr/tf of rising/falling times and a ratio tplh/tphl of low-to-high/high-to-low propagation delay times that are close to 1 may be referred to as a balancing cell.

When a normalized width of a fin transistor is about 53, at least one width from among a plurality of fins included in the fin transistor may be determined to be different from widths of the other fins based on a ratio tr/tf of rising/falling times and a ratio tplh/tphl of low-to-high/high-to-low propagation delay times. For example, in order to set a ratio tr/tf of rising/falling times and a ratio tplh/tphl of low-to-high/high-to-low propagation delay times to be close to 0.800, widths of the plurality of fins may be finely adjusted.

According to the present example embodiment, the electrical characteristics of a fin transistor may be determined based on a set value of a ratio tr/tf of rising/falling times or a ratio tplh/tphl of low-to-high/high-to-low propagation delay times of the fin transistor, and a width of a plurality of fins may be individually determined based on the electrical characteristics of the fin transistor. However, example embodiments are not limited thereto, and the electrical characteristics of a fin transistor may be determined based on other various factors.

Figure 13:
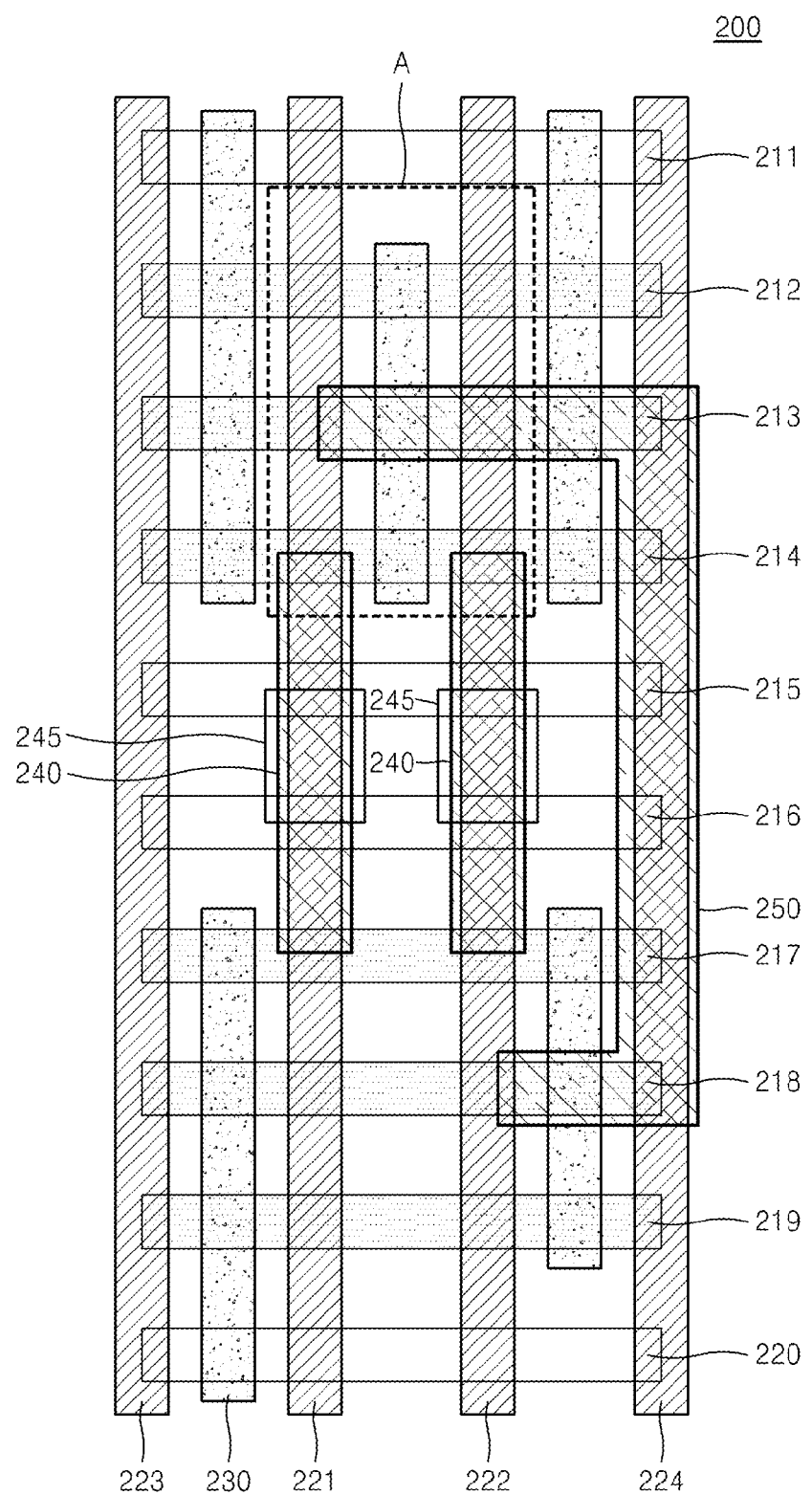
FIG. 13 is an initial layout of a semiconductor integrated circuit according to another example embodiment of inventive concepts.

FIG. 13 is an initial layout of a semiconductor integrated circuit 200 according to another example embodiment of inventive concepts. For example, FIG. 13 illustrates a standard cell included in the semiconductor integrated circuit 200.

Referring to FIG. 13, the semiconductor integrated circuit 200 may include first through tenth fins 211 through 220, a plurality of gate electrodes 221 and 222, a plurality of dummy gate electrodes 223 and 224, a plurality of source/drain contacts 230, two input terminals 240, two input contacts 245, and an output terminal 250. In the present example embodiment, the first, fifth, sixth, and tenth fins 211, 215, 216, and 220 may be dummy fins, and the second through fourth, and seventh through ninth fins 212, 213, 214, 217, 218, and 219 may be active fins.

The first through tenth fins 211 through 220 may be previously formed on a semiconductor substrate (not shown) by using a single process. Next, the plurality of gate electrodes 221 and 222 and the plurality of dummy gate electrodes 223 and 224, and the plurality of source/drain contacts 230 may be formed. Next, the two input terminals 240 and the output terminal 250 may be formed.

In the present example embodiment, the second through fourth fins 212, 213, and 214 may constitute a PMOS transistor, and the seventh through ninth fins 217, 218, and 219 may constitute an NMOS transistor. For example, since the two gate electrodes 221 and 222 and the three source/drain contacts 230 are disposed on the second through fourth fins 212, 213, and 214, the second through fourth fins 212, 213, and 214 may constitute two PMOS transistors which are connected in parallel. Also, since the two gate electrodes 221 and 222 and the two source/drain contact holes 230 are disposed on the seventh through ninth fins 217, 218, and 219, the seventh through ninth fins 217, 218, and 219 may constitute two NMOS transistors which are connected in series. Accordingly, the semiconductor integrated circuit 200 may be a NAND gate cell. However, example embodiments are not limited thereto.

Figure 14:
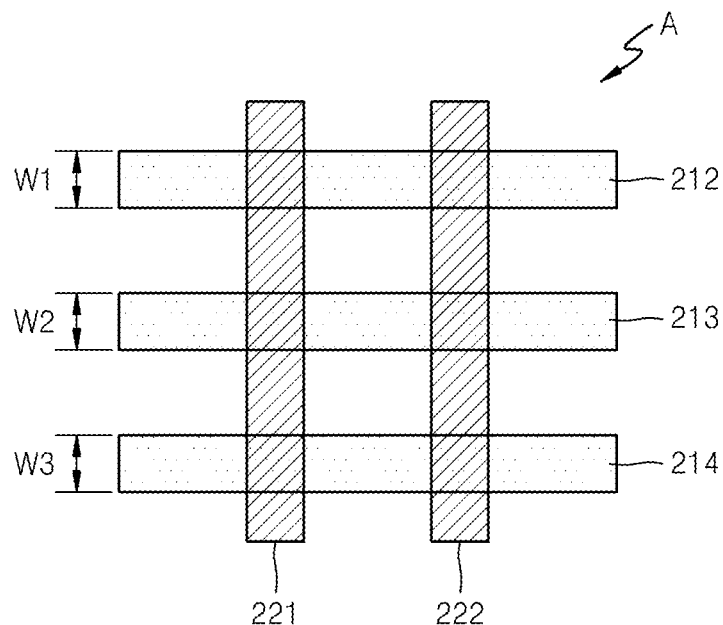
FIG. 14 is a layout illustrating an area A of FIG. 13.

FIG. 14 is a layout illustrating an area A of FIG. 13.

Referring to FIG. 14, the area A includes the second through fourth fins 212, 213, and 214, and the gate electrodes 221 and 222. The source/drain contacts 230, the two input terminals 240, and the output terminal 250 included in the area A of FIG. 13 are not shown in FIG. 14 for convenience.

According to the present example embodiment, widths W1, W2, and W3 of the fins 212-214 may be determined to be the same in an initial layout of the semiconductor integrated circuit 200. In this case, the widths W1, W2, and W3 of the fins 212-214 indicate widths shown in a 2D layout. Since FIG. 14 is a 2D layout, height information of the fins 212-214 is not shown.

According to the present example embodiment, the widths W1, W2, and W3 of the fins 212-214 may be determined to be different from one another based on the electrical characteristics of the semiconductor integrated circuit 200. A new library may be generated by generating a mark layer that displays a fin whose width is to be changed and applying the mark layer to an initial layout, for example, a previously created layout.

Figure 15:
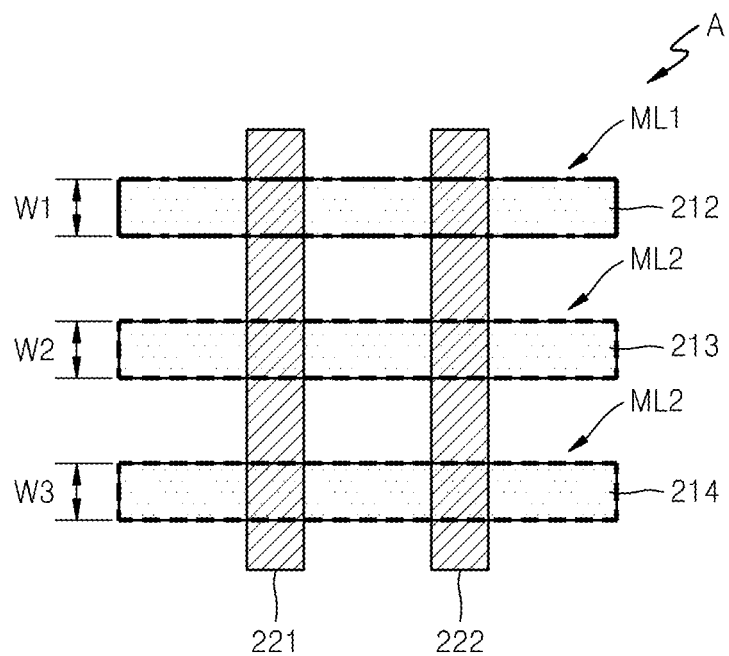
FIG. 15 shows the layout of FIG. 14 to which mark layers are applied.

A situation where the width W1 of the second fin 212 is determined to be increased and the widths W2 and W3 of the third and fourth fins 213 and 214 are determined to be decreased based on the electrical characteristics of the semiconductor integrated circuit 200 will be described in detail. For example, mark layers that indicate the fins 212-214 whose widths W1, W2, and W3 are to be changed are generated, and a new library may be generated by applying the mark layers to a previously created layout, for example, an initial layout. FIG. 15 shows the layout of FIG. 14 to which mark layers are applied.

Referring to FIG. 15, when the width W1 of the second fin 212 is determined to be increased, a first mark layer ML1 that displays the second fin 212 may be generated. For example, the first mark layer ML1 may indicate an increase in a width of a fin included in a previously created layout. If the widths W2 and W3 of the third and fourth fins 213 and 214 are determined to be decreased, a second mark layer ML2 that includes the third and fourth fins 213 and 214 may be generated. The second mark layer ML2 may indicate a decrease in the width of the fin included in the previously created layout. The first mark layer ML1 and the second mark layer ML2 may be displayed in different colors. Alternatively, the first mark layer ML1 and the second mark layer ML2 may be displayed with different boundaries.

Figure 16:
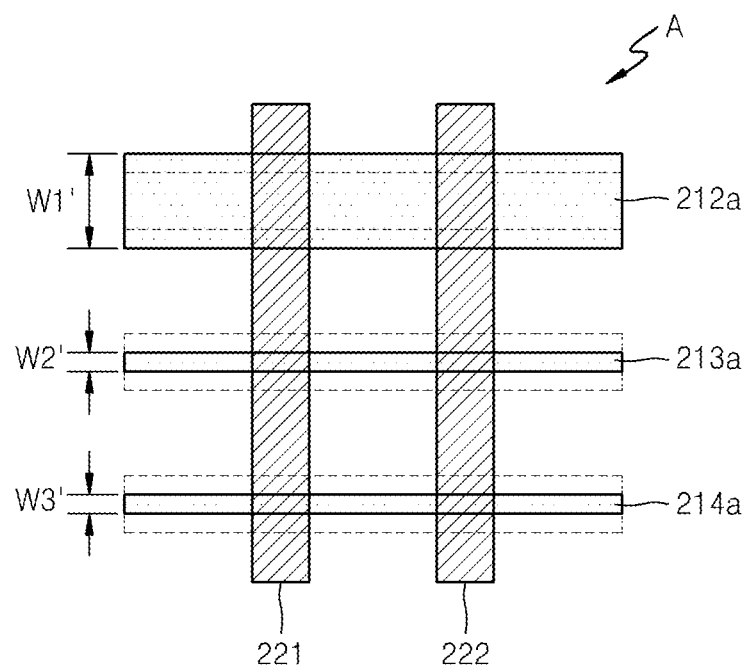
FIG. 16 is a layout of a semiconductor integrated circuit including a fin transistor including a fin whose width is changed according to a new library generated based on first and second mark layers of FIG. 16.

FIG. 16 is a layout of a semiconductor integrated circuit including a fin whose width is changed according to a new library generated based on the first and second mark layers ML1 and ML2 of FIG. 15.

Referring to FIG. 16, a new library including fins 212a-214a whose widths W1, W2, and W3 are changed may be generated by applying the first and second mark layers ML1 and ML2 to a previously created layout of the semiconductor integrated circuit 200. Accordingly, widths of the fins 212a-214a may respectively be changed to first through third new widths W1', W2', and W3'.

Figure 17:
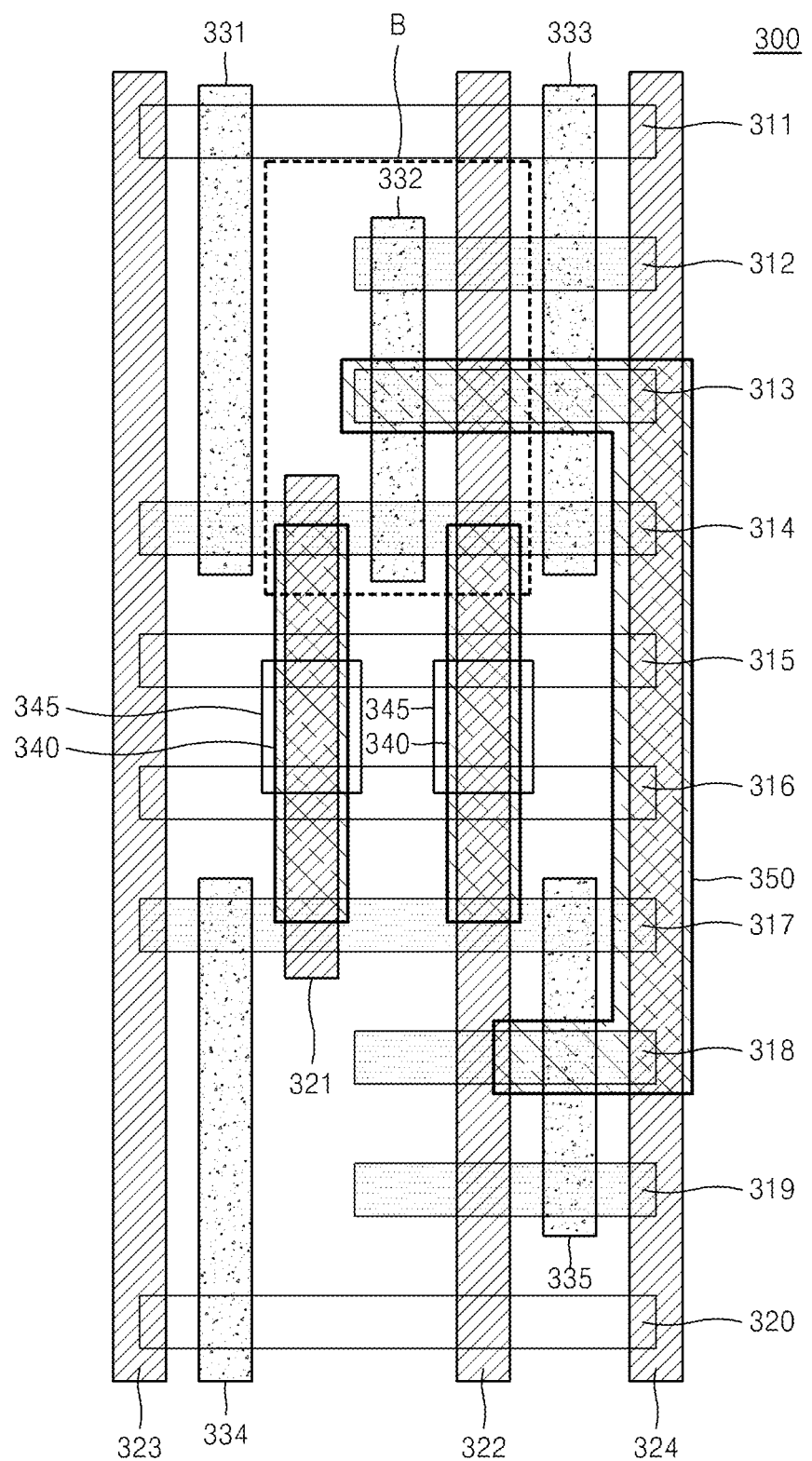
FIG. 17 is an initial layout of a semiconductor integrated circuit according to another example embodiment of inventive concepts.

FIG. 17 is an initial layout of a semiconductor integrated circuit 300 according to another example embodiment of inventive concepts. For example, FIG. 17 illustrates a standard cell included in the semiconductor integrated circuit 300.

Referring to FIG. 17, the semiconductor integrated circuit 300 may include fins 311-320, a plurality of gate electrodes 321 and 322, a plurality of dummy gate electrodes 323 and 324, a plurality of source/drain contacts 331, 332, 333, 334, and 335, two input terminals 340, two input contacts 345, and an output terminal 350. In the present example embodiment, the fins 311, 315, 316, and 320 may be dummy fins, and the fins 312-314 and 317-319 may be active fins.

The fins 311-320 may be previously formed on a semiconductor substrate (not shown) by using a single process. Next, the plurality of gate electrodes 321 and 322 and the plurality of dummy gate electrodes 323 and 324, and the plurality of source/drain contacts 331-335 may be formed. Next, the two input terminals 340 and the output terminal 350 may be formed.

In the present example embodiment, the fins 312-314 may respectively constitute PMOS transistors, and the fins 317-319 may respectively constitute NMOS transistors. For example, the fourth fin 314 may constitute a first PMOS transistor along with the two source/drain contacts 331 and 332 and the gate electrode 321. Also, the fins 312-314 may constitute a second PMOS transistor along with the two source/drain contacts 332 and 333 and the gate electrode 322. Also, the seventh fin 317 may constitute a first NMOS transistor along with the source/drain contact 334 and the gate electrode 321. Also, the fins 317-319 may constitute a second NMOS transistor along with the source/drain contact 335 and the gate electrode 322. As such, according to the present example embodiment, one fin may constitute one fin transistor, and a plurality of fins may constitute one fin transistor. However, example embodiments are not limited thereto.

Figure 18:
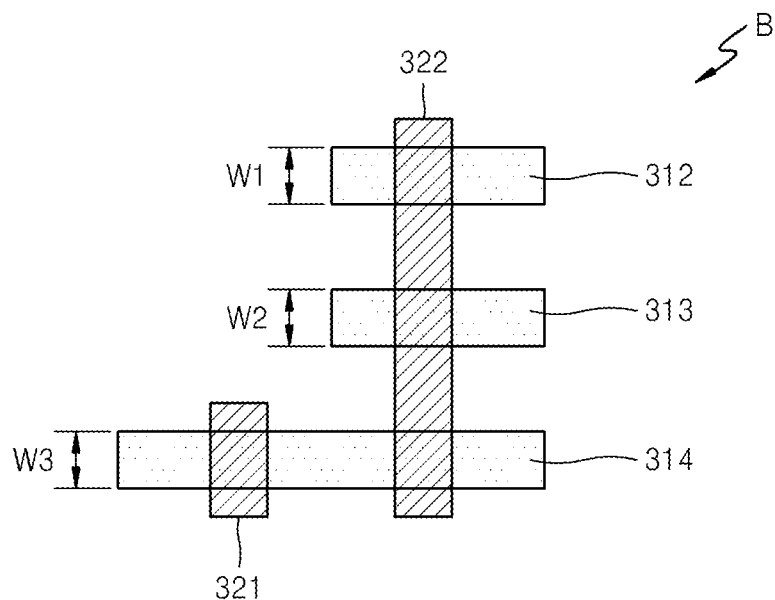
FIG. 18 is a layout illustrating an area B of FIG. 17.

FIG. 18 is a layout illustrating an area B of FIG. 17.

Referring to FIG. 18, the area B includes the fins 312-314 and the gate electrodes 321 and 322. The source/drain contact 332, the two input terminals 340, and the output terminal 350 included in the area B of FIG. 17 are not shown for convenience.

According to the present example embodiment, widths W1, W2, and W3 of the fins 312-314 may be determined to be the same in an initial layout of the semiconductor integrated circuit 300. In this case, the widths W1, W2, and W3 of the fins 312-314 indicate widths displayed in a 2D layout. Since FIG. 18 is a 2D layout, height information of the fins 312-314 is not displayed.

According to the present example embodiment, the widths W1, W2, and W3 of the fins 312-314 may be determined to be different from one another based on electrical characteristics of the semiconductor integrated circuit 300. A new library may be generated by generating a mark layer that displays a fin whose width is to be changed and applying the mark layer to an initial layout, that is, a previously created layout.

A case where the width W2 of the third fin 313 is determined to be decreased and the widths W1 and W3 of the second and fourth fins 312 and 314 are determined to be increased based on a change in the electrical characteristics of the semiconductor integrated circuit 300 will be described in detail. For example, a new library may be generated by generating a mark layer that displays the fins 312-314 whose widths are to be changed and applying the mark layer to a previously created layout, for example, an initial layout.

Figure 19:
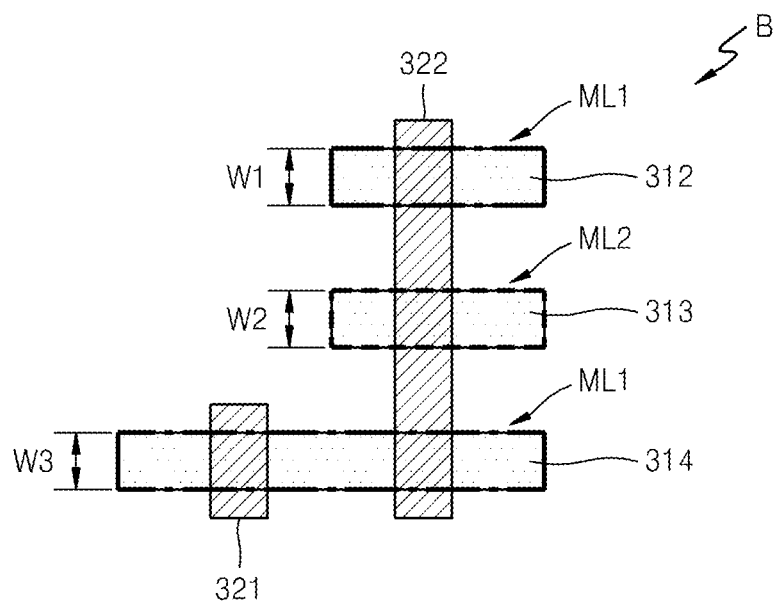
FIG. 19 shows the layout of FIG. 18 to which mark layers are applied.

FIG. 19 shows the layout of FIG. 18 to which mark layers are applied.

Referring to FIG. 19, when the width W2 of the third fin 313 is determined to be decreased, a second mark layer ML2 that displays the third fin 313 may be generated. In this case, the second mark layer ML2 may indicate a decrease in a width of a fin included in a previously created layout. Also, when the widths W1 and W3 of the second and fourth fins 312 and 314 are determined to be increased, a first mark layer ML1 that displays the second and fourth fins 312 and 314 may be generated. In this case, the first mark layer ML1 may indicate an increase in the width of the fin included in the previously created layout. The first mark layer ML1 and the second mark layer ML2 may be displayed in different colors. Alternatively, the first mark layer ML1 and the second mark layer ML2 may be displayed with different boundaries.

Figure 20:
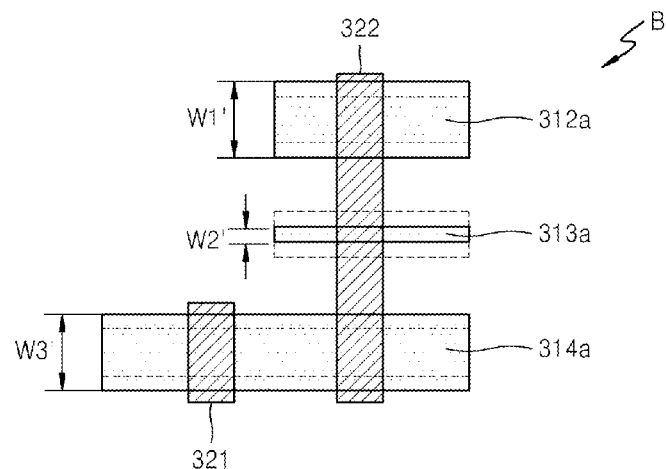
FIG. 20 is a layout of a semiconductor integrated circuit including a fin transistor including a fin whose width is changed according to a new library generated based on first and second mark layers of FIG. 19.

FIG. 20 is a layout of a semiconductor integrated circuit including a fin whose width is changed according to a new library generated based on the first and second mark layers ML1 and ML2 of FIG. 19.

Referring to FIG. 20, a new library including fins 312a-314a whose widths W1, W2, and W3 are changed may be generated by applying the first and second mark layers ML1 and ML2 to a previously created layout of the semiconductor integrated circuit 300. Accordingly, widths of the fins 312a-314a may be changed to new widths W1', W2', and W3', respectively.

Figure 21:
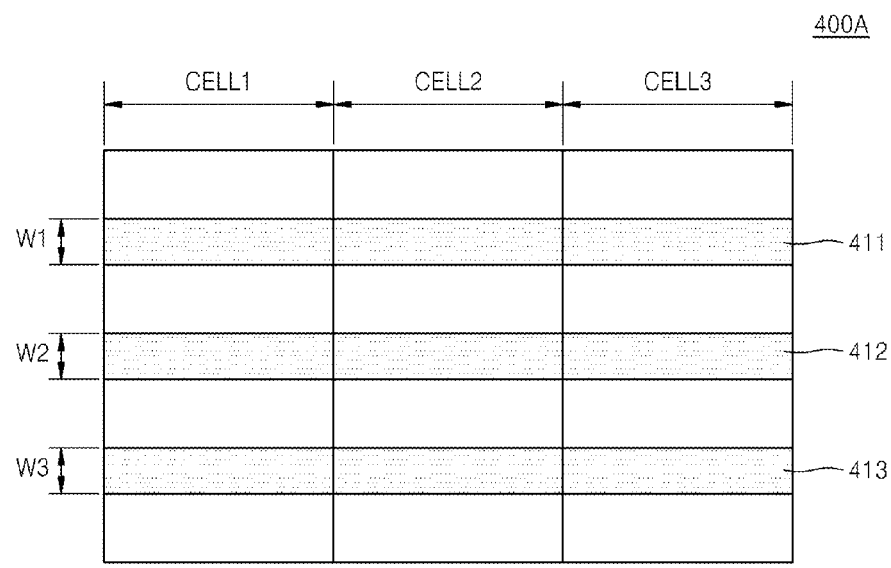
FIG. 21 is an initial layout of a semiconductor integrated circuit according to another example embodiment of inventive concepts.

FIG. 21 is an initial layout of a semiconductor integrated circuit 400A according to another example embodiment of inventive concepts.

Referring to FIG. 21, the semiconductor integrated circuit 400A may include first through third cells CELL1, CELL2, and CELL3 that are arranged adjacent to one another, and threshold voltages of the first through third cells CELL1, CELL2, and CELL3 may be the same. The first through third cells CELL1, CELL2, and CELL3 may include first through third fins 411, 412, and 413 which are arranged adjacent to one another. A gate electrode, and source/drain contacts are not shown in FIG. 21 for convenience.

According to the present example embodiment, in the initial layout of the semiconductor integrated circuit 400A, widths W1, W2, and W3 of the first through third fins 411, 412, and 413 may be determined to be the same. In this case, the widths W1, W2, and W3 of the first through third fins 411, 412, and 413 indicate widths shown in a 2D layout. Since FIG. 21 is a 2D layout, height information of the first through third fins 411, 412, and 413 is not displayed.

According to the present example embodiment, based on the electrical characteristics of the semiconductor integrated circuit 400A, a threshold voltage of the second cell CELL2 from among the first through third cells CELL1, CELL2, and CELL3 may be determined to be changed to a predetermined level, and the widths W 1, W2, and W3 of the first through third fins 411, 412, and 413 included in the second cell CELL2 may be changed. For example, the widths W1, W2, and W3 of the first through third fins 411, 412, and 413 included in the second cell CELL2 may be determined to be different from one another. A new library may be generated by generating a mark layer that displays a fin whose width is to be changed and applying the mark layer to an initial layout, that is, a previously created layout.

A situation where the width W1 of the first fin 411 from among the first through third fins 411, 412, and 413 included in the second cell CELL2 is determined to be increased and the widths W2 and W3 of the second and third fins 412 and 413 are determined to be decreased based on a change in the electrical characteristics of the semiconductor integrated circuit 400A will be described in detail. In this case, a new library may be generated by generating a mark layer that displays the first through third fins 411, 412, and 413 whose widths are to be changed and applying the mark layer to a previously created layout, for example, an initial layout.

Figure 22:
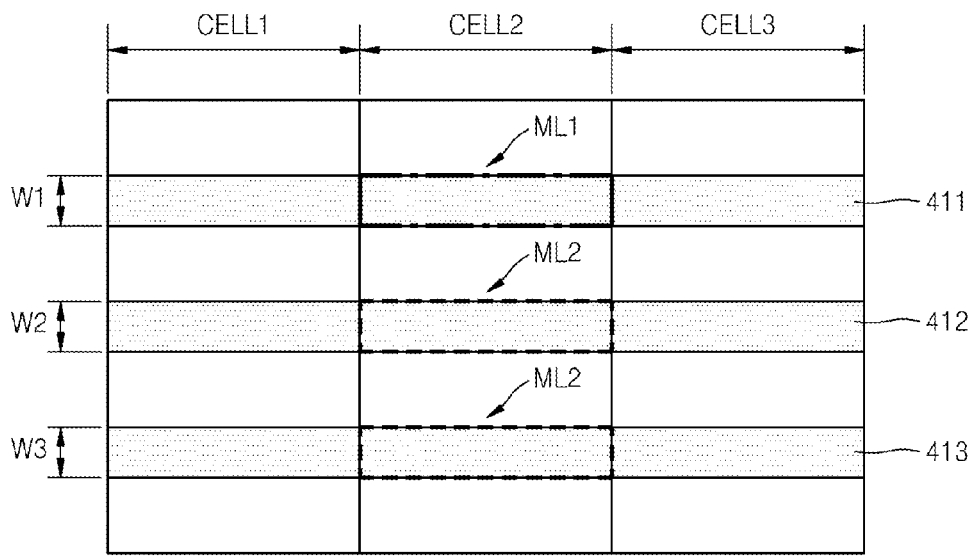
FIG. 22 shows the layout of FIG. 21 to which mark layers are applied, according to an example embodiment of inventive concepts.

FIG. 22 shows the layout of FIG. 21 to which mark layers are applied, according to an example embodiment of inventive concepts.

Referring to FIG. 22, when the width W1 of the first fin 411 included in the second cell CELL2 is determined to be increased, a first mark layer ML1 that displays the first fin 411 included in the second cell CELL2 may be generated. In this case, the first mark layer ML1 may indicate an increase in a width of a fin included in a previously created layout. Also, when the widths W2 and W3 of the second and third fins 412 and 413 included in the second cell CELL2 are determined to be decreased, a second mark layer ML2 that displays the second and third fins 412 and 413 included in the second cell CELL2 may be generated. In this case, the second mark layer ML2 may indicate a decrease in the width of the fin included in the previously created layout. The first mark layer ML1 and the second mark layer ML2 may be displayed in different colors. Alternatively, the first mark layer ML1 and the second mark layer ML2 may be displayed with different boundaries.

Figure 23:
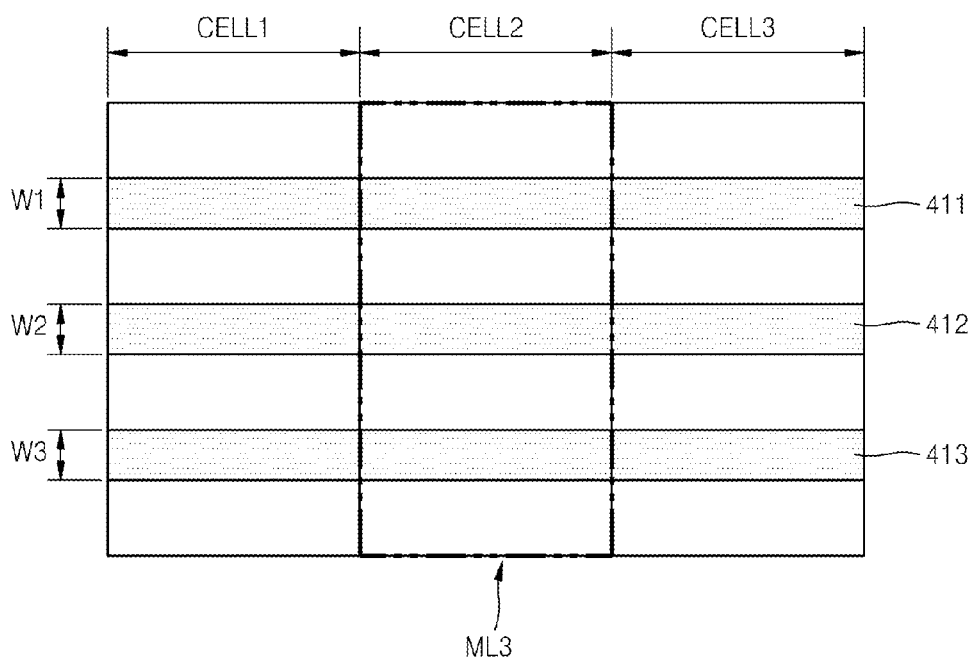
FIG. 23 shows the layout of FIG. 21 to which mark layers are applied, according to another example embodiment of inventive concepts.

FIG. 23 shows the layout of FIG. 21 to which mark layers are applied, according to another example embodiment of inventive concepts.

Referring to FIG. 23, when the widths W1, W2, and W3 of the first through third fins 411, 412, and 413 included in the second cell CELL2 are determined to be changed, a third mark layer ML3 that displays the second cell CELL2 may be generated. For example, the third mark layer ML3 may be displayed on a cell boundary of the second cell CELL2, and information about a change in the widths W1, W2, and W3 of the first through third fins 411, 412, and 413 may be separately provided. The third mark layer ML3 may be displayed in a color different from those of the first and second mark layers ML1 and ML2. Alternatively, the third mark layer ML3 may be displayed with a boundary different from those of the first and second mark layers ML1 and ML2.

Figure 24:
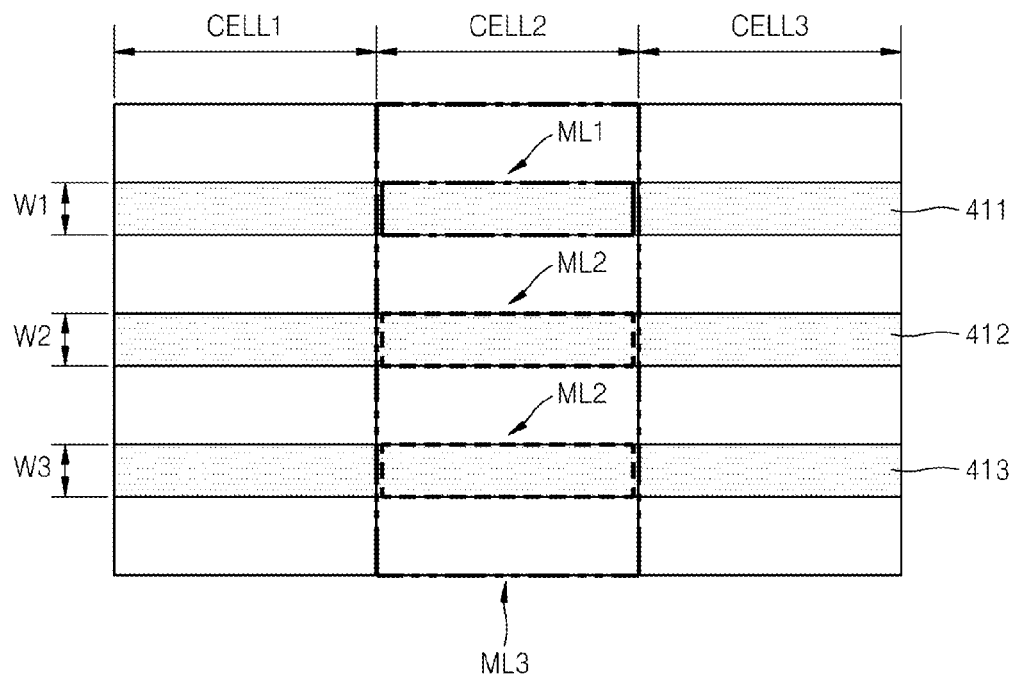
FIG. 24 shows the layout of FIG. 21 to which mark layers are applied, according to another example embodiment of inventive concepts.

FIG. 24 shows the layout of FIG. 21 to which mark layers are applied, according to another example embodiment of inventive concepts.

Referring to FIG. 24, when the widths W1, W2, and W3 of the first through third fins 411, 412, and 413 included in the second cell CELL2 are determined to be changed, a first mark layer ML1 that indicates the first fin 411, a second mark layer ML2 that indicates the second and third fins 412 and 413, and a third mark layer ML3 that indicates the second cell CELL2 may be generated. For example, the third mark layer ML3 may be displayed on a cell boundary of the second cell CELL2. The first through third mark layers ML1, ML2, and ML3 may be displayed in different colors. Alternatively, the first through third mark layers ML1, ML2, and ML3 may be displayed with different boundaries.

Figure 25:
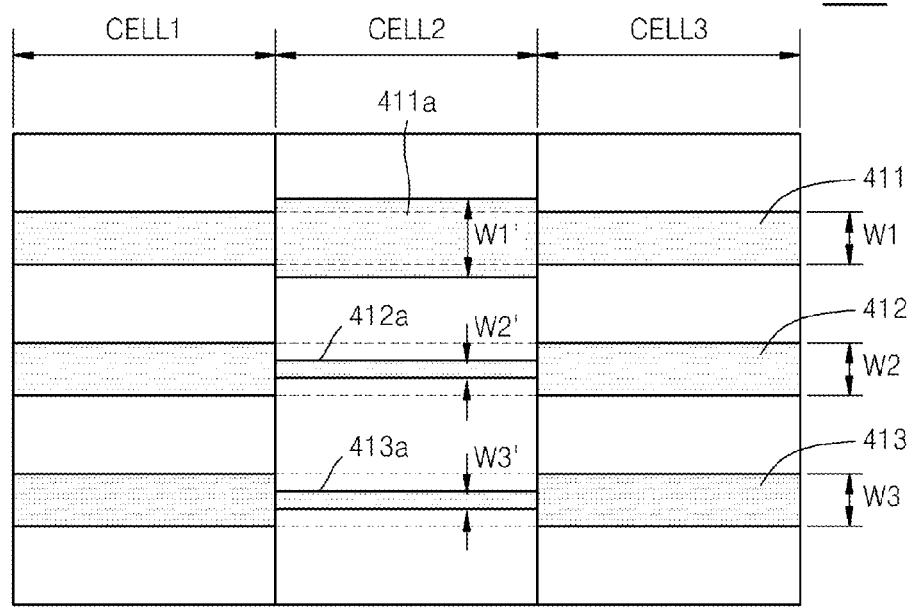
FIG. 25 is a layout of a semiconductor integrated circuit including a fin transistor including a fin whose width is changed according to a new library generated based on at least one of mark layers of FIGS. 22 through 24.

FIG. 25 is a layout of a semiconductor integrated circuit 400E including a fin whose width is changed according to a new library generated based on one of mark layers of FIGS. 22 through 24.

Referring to FIG. 25, a new library including first through third fins 411a, 412a, and 413a obtained by changing the widths W1, W2, and W3 of the first through third fins 411, 412, and 413 included in the second cell CELL2 may be generated by applying one of mark layers of FIGS. 23 through 25 to a previously created layout of the semiconductor integrated circuit 400A. Accordingly, widths of the first through third fins 411a, 412a, and 413a may be changed to first through third new widths W1', W2', and W3'.

Figure 26:
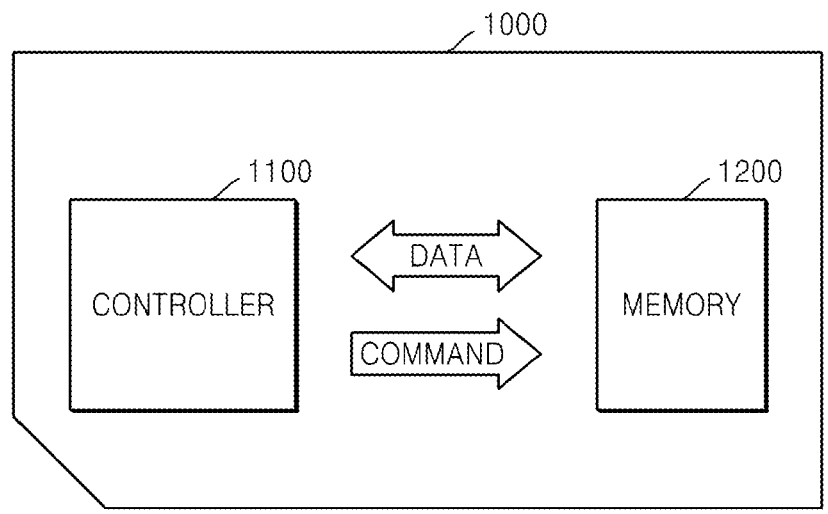
FIG. 26 is a block diagram illustrating a memory card including a semiconductor integrated circuit, according to an example embodiment of inventive concepts.

FIG. 26 is a block diagram illustrating a memory card 1000 including a semiconductor integrated circuit, according to an example embodiment of inventive concepts.

Referring to FIG. 26, the memory card 1000 may be disposed such that a controller 1100 and a memory 1200 exchange electrical signals. For example, when the controller 1100 outputs a command, the memory 1200 may transmit data.

The controller 1100 and the memory 1200 may include a semiconductor integrated circuit according to some example embodiments of inventive concepts. For example, in at least one semiconductor element from among a plurality of semiconductor elements included in the controller 1100 and the memory 1200, a width of at least one fin from among a plurality of fins of a fin transistor may be changed based on a change in the characteristics of the semiconductor element or the fin transistor included in the semiconductor element. For example, a width of the at least one fin may be changed according to a new library generated by using a mark layer that displays the at least one fin. In particular, the controller 1100 and the memory 1200 may include semiconductor elements, for example, fin transistors.

The memory card 1000 may be any of various cards, for example, a memory stick card, a smart media (SM) card, a secure digital (SD) card, a mini-SD card, and a multimedia card (MMC).

Figure 27:
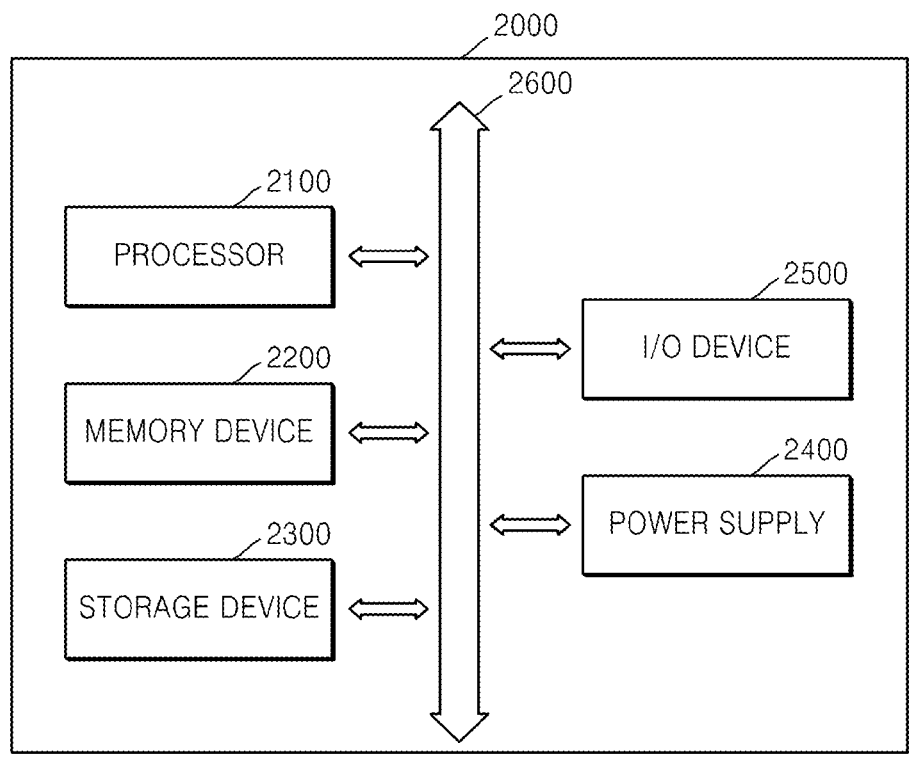
FIG. 27 is a block diagram illustrating a computing system including a semiconductor integrated circuit, according to an example embodiment of inventive concepts.

FIG. 27 is a block diagram illustrating a computing system 2000 including a semiconductor integrated circuit, according to an example embodiment of inventive concepts.

Referring to FIG. 27, the computing system 2000 may include a processor 2100, a memory device 2200, a storage device 2300, a power supply 2400, and an input/output (I/O) device 2500. Although not shown in FIG. 27, the computing system 2000 may further include ports that may communicate with a video card, a sound card, a memory card, or a universal serial bus (USB), or may communicate with other electronic devices.

The processor 2100, the memory device 2200, the storage device 2300, the power supply 2400, and the I/O device 2500 included in the computing system 2000 may include a semiconductor integrated circuit according to some example embodiments of inventive concepts. For example, in at least one semiconductor element from among a plurality of semiconductor elements included in the processor 2100, the memory device 2200, the storage device 2300, the power supply 2400, and the I/O device 2500, a width of at least one fin from among a plurality of fins of a fin transistor may be changed based on a change in the characteristics of the semiconductor element or the fin transistor included in the semiconductor element. For example, a width of the at least one fin of the fin transistor may be changed according to a new library generated by using a mark layer that indicates at least one fin for changing the width of the at least one fin of the transistor. In particular, the processor 2100, the memory device 2200, the storage device 2300, the power supply 2400, and the I/O device 2500 included in the computing system 2000 may include semiconductor elements, for example, fin transistors, according to the one or more example embodiments of inventive concepts.

The processor 2100 may perform specific computations or tasks. The processor 2100 may be a microprocessor or a central processing unit (CPU). The processor 2100 may communicate with the memory device 2200, the storage device 2300, and the I/O device 2500 via a bus 2600 such as an address bus, a control bus, or a data base. The processor 2100 may be connected to an extended bus such as a peripheral component interconnect (PCI) bus.

The memory device 2200 may store data needed to operate the computing system 2000. For example, the memory device 2200 may be dynamic random-access memory (DRAM), mobile DRAM, static random-access memory (SRAM), phase-change random-access memory (PRAM), ferroelectric random-access memory (FRAM), resistive random-access memory (RRAM), and/or magnetic random-access memory (MRAM). The storage device 2300 may include a solid state drive, a hard disk drive, or a CD-ROM.

The I/O device 2500 may include an input unit such as a keyboard, a keypad, or a mouse and an output unit such as a printer or a display. The power supply 2400 may supply an operating voltage to the computing system 2000.

The semiconductor integrated circuit according to any of the example embodiments of inventive concepts may be embodied as a package of various types. For example, at least some elements of the semiconductor integrated circuit may be mounted by using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

While example embodiments of inventive concepts have been particularly shown and described with reference to some example embodiments thereof, it will be understood that various changes in form and details may be made therein without departing from the spirit and scope of the following claims. Therefore, the scope of example embodiments of inventive concepts is defined not by the detailed description but by the appended claims, and all differences within the scope will be construed as being included in example embodiments of inventive concepts.

What is claimed is:

1. A multi-fin transistor comprising:
a plurality of fins; and
a common gate electrode above the plurality of fins,
wherein a width of at least one fin of the plurality of fins is different from widths of the other fins, and each width of the plurality of fins is individually determined based on electrical characteristics of the multi-fin transistor,
wherein the width of the at least one fin is indicated in a design unit by a mark layer to change the width based on the electrical characteristics of the multi-fin transistor
wherein the width of the at least one fin is changed in the design unit according to a new library generated by using the mark layer, and
wherein the mark layer comprises at least one of,
a first mark layer configured to indicate an increase in a width of at least one fin set in a previously designed layout, and
a second mark layer configured to indicate a decrease in the width of the at least one fin set to the previously designed layout.

2. The multi-fin transistor of claim 1, wherein the first and second mark layers are distinguished from each other in the design unit by using at least one of different colors and different boundaries.

3. A multi-fin transistor comprising:
a plurality of fins; and
a common gate electrode above the plurality of fins,
wherein a width of at least one fin of the plurality of fins is different from widths of the other fins, and each width of the plurality of fins is individually determined based on electrical characteristics of the multi-fin transistor,
wherein the width of the at least one fin is indicated in a design unit by a mark layer to change the width based on the electrical characteristics of the multi-fin transistor, and
wherein a pitch between the plurality of fins is constant even when the width of the at least one fin is changed.

4. The multi-fin transistor of claim 3, wherein the mark layer comprises at least one of:
a first mark layer configured to indicate the at least one fin; and
a second mark layer configured to indicate the multi-fin transistor including the at least one fin.

5. The multi-fin transistor of claim 3, wherein the plurality of fins comprise at least one active fin.

6. The multi-fin transistor of claim 3, wherein the plurality of fins include at least one dummy fin.

7. A multi-fin transistor comprising:
a plurality of fins; and
a common gate electrode above the plurality of fins,
wherein a width of at least one fin of the plurality of fins is different from widths of the other fins, and each width of the plurality of fins is individually determined based on electrical characteristics of the multi-fin transistor, and
wherein when all of the plurality of fins are active fins, a number of the plurality of fins is r, and a number of selectable widths is n (r and n being natural numbers equal to or greater than 2), a number of cases for a total width of the multi-fin transistor is nHr, which is a repeating combination based on the numbers r and n.

8. A multi-fin transistor comprising:
a plurality of fins; and
a common gate electrode above the plurality of fins,
wherein a width of at least one fin of the plurality of fins is different from widths of the other fins, and each width of the plurality of fins is individually determined based on electrical characteristics of the multi-fin transistor, and
wherein when a number of the plurality of fins is r and a number of selectable widths is n (r and n being natural numbers equal to or greater than 2), a number of cases for a total width of the fin transistor is $$\sum_{i=1}^{r} nHi,$$

which is a sum of repeating combinations based on the numbers r and n.

9. The multi-fin transistor of claim 3, wherein the electrical characteristics of the multi-fin transistor are determined based on a set value of a ratio of a rising time to a falling time of the multi-fin transistor.

10. The multi-fin transistor of claim 3, wherein the electrical characteristics of the multi-fin transistor are determined based on a set value of a ratio of a low-to-high propagation delay time to a high-to-low propagation delay time of the multi-fin transistor.

11. The multi-fin transistor of claim 3, wherein the each width of the plurality of fins is a width shown in a two-dimensional (2D) layout.

12. A non-transitory computer program product, loadable directly into a memory of an image processing system, comprising:
 a tangible computer readable medium including program code segments embedded thereon,
 wherein the computer program product is configured to design a library of a multi-fin transistor including a plurality of fins based on layouts, and generate a new library by generating and applying at least one mark layer to a previously-created layout when changing a width of at least one fin of the plurality of fins based on electrical characteristics of the multi-fin transistor.

13. The computer program product of claim 12, wherein
 the width of the at least one fin is indicated in a design unit by a mark layer to change the width based on the electrical characteristics of the multi-fin transistor, and
 the width of the at least one fin is changed in the design unit according to a new library generated using the mark layer.

14. The computer program product Of claim 13, wherein the mark layer comprises at least one of:
 a first mark layer configured to indicate an increase in a width of at least one fin set in a previously designed layout; and
 a second mark layer configured to indicate a decrease in the width of the at least one fin set to the previously designed layout.

15. The computer program product of claim 14, wherein the first and second mark layers are distinguished from each other in the design unit by using at least one of different colors and different boundaries.

16. The computer program product of claim 12, wherein a pitch between the plurality of fins is constant even when the width of the at least one fin is changed.

* * * * *